United States Patent
Ross et al.

(10) Patent No.: US 10,965,502 B2
(45) Date of Patent: *Mar. 30, 2021

(54) MULTIPATH FILTERS

(71) Applicant: Skyworks Solutions, Inc., Irvine, CA (US)

(72) Inventors: Alexander John Heaslip Ross, Portland (CA); John William Mitchell Rogers, Nepean (CA)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/565,023

(22) Filed: Sep. 9, 2019

(65) Prior Publication Data
US 2020/0099552 A1 Mar. 26, 2020

Related U.S. Application Data

(63) Continuation of application No. 15/902,190, filed on Feb. 22, 2018, now Pat. No. 10,454,724.
(Continued)

(51) Int. Cl.
*H04B 1/10* (2006.01)
*H04L 25/03* (2006.01)
(Continued)

(52) U.S. Cl.
CPC ..... *H04L 25/03828* (2013.01); *H03H 19/002* (2013.01); *H04B 1/16* (2013.01); *H04L 25/03114* (2013.01)

(58) Field of Classification Search
CPC ........ H04L 25/03828; H04L 25/03114; H03H 19/002; H04B 1/16; H04B 1/71637; H04B 1/0475; H03G 3/3042
(Continued)

(56) References Cited

U.S. PATENT DOCUMENTS

| 5,339,057 A | 8/1994 | Rauscher |
| 8,219,059 B2 | 7/2012 | Pera et al. |

(Continued)

OTHER PUBLICATIONS

Chun et al., "Switchable Embedded Notch Structure for UWB Bandpass Filter" IEEE Microwave and Wireless Components Letters, vol. 18, No. 9, Sep. 2008, in 3 pages.
(Continued)

*Primary Examiner* — Phuong Phu
(74) *Attorney, Agent, or Firm* — Knobbe, Martens, Olson & Bear, LLP

(57) ABSTRACT

Multipath filters are provided herein. In certain configurations, a multipath filter includes multiple filter paths or circuit branches that are electrically connected in parallel with one another between an input terminal and an output terminal. The input terminal receives an input signal, and each filter circuit branch includes a double-in double-switched (DIDS) downconverter that downconverts the input signal with two different clock signal phases to generate a downconverted signal. Each filter circuit branch further includes a filter network that generates a filtered signal by filtering the downconverted signal and an upconverter that upconverts the filtered signal to generate a branch output signal. Additionally, the branch output signals from the filter circuit branches are combined to generate an output signal at the output terminal.

20 Claims, 16 Drawing Sheets

Related U.S. Application Data

(60) Provisional application No. 62/462,555, filed on Feb. 23, 2017.

(51) Int. Cl.
*H04B 1/16* (2006.01)
*H03H 19/00* (2006.01)

(58) Field of Classification Search
USPC .......................................... 375/350, 229, 316
See application file for complete search history.

(56) References Cited

U.S. PATENT DOCUMENTS

| | | | |
|---|---|---|---|
| 9,294,138 B2 | 3/2016 | Su et al. | |
| 9,407,482 B2 | 8/2016 | Aggarwal et al. | |
| 9,991,914 B1 | 6/2018 | Lee et al. | |
| 10,454,724 B2* | 10/2019 | Ross | H03H 19/002 |
| 10,484,211 B2 | 11/2019 | Rogers et al. | |
| 2005/0271118 A1* | 12/2005 | Paquelet | H04B 1/71637 |
| | | | 375/130 |
| 2009/0231170 A1 | 9/2009 | Jung et al. | |
| 2009/0233568 A1 | 9/2009 | Zhang et al. | |
| 2012/0170624 A1* | 7/2012 | Rozenblit | H03G 3/3042 |
| | | | 375/219 |
| 2014/0232468 A1* | 8/2014 | Hulbert | H04B 1/0475 |
| | | | 330/293 |
| 2016/0218673 A1 | 7/2016 | Anderson et al. | |
| 2016/0322996 A1 | 11/2016 | Jabbour et al. | |
| 2020/0112461 A1 | 4/2020 | Rogers et al. | |

OTHER PUBLICATIONS

Galpin, R.K.P., "Narrow-Bandpass Filtering with Modulation" Electronics Letters, The Institute of Electronics Engineers, vol. 4, No. 9, May 3, 1968, in 2 pages.

Ghaffari et al., "A Differential 4-Path Highly Linear Widely Tunable On-Chip Band-Pass Filter" Radio Frequency Integrated Circuits Symposium, IEEE 2010, in 4 pages.

Lepage et al., "Analysis of a Comb Filter Using Synchronously Commutated Capacitors" Mar. 1953, in 6 pages.

Pelliccia et al., "Compact Ultra-Wideband Planar Filter with RF-MEMS-Based Tunable Notched Band" Proceedings of APMC 2012, Kaohsiung, Taiwan, Dec. 4-7, 2012, in 3 pages.

Rabbi et al. "Compact UWB Bandpass Filter with Reconfigurable Notched Band" in 2 pages.

Wang et al., "A UWB Filter with Tunable Notch Using Microstrip/Slotline Structure with T-Slot Stub" IEEE 2016, in 3 pages.

* cited by examiner

MULTIPATH FILTERS

CROSS-REFERENCE TO RELATED APPLICATIONS

This application is a continuation of U.S. application Ser. No. 15/902,190, filed Feb. 22, 2018 and titled "MULTIPATH FILTERS," which claims the benefit of priority under 35 U.S.C. § 119 of U.S. Provisional Patent Application No. 62/462,555, filed Feb. 23, 2017 and titled "MULTIPATH FILTERS," which is herein incorporated by reference in its entirety.

BACKGROUND

Field

Embodiments of the invention relate to electronic systems, and in particular, to radio frequency (RF) electronics.

Description of Related Technology

Radio frequency (RF) communication systems can be used for transmitting and/or receiving signals of a wide range of frequencies. For example, an RF communication system can be used to wirelessly communicate RF signals in a frequency range of about 30 kHz to 300 GHz, such as in the range of about 450 MHz to about 6 GHz for certain communications standards.

Examples of RF communication systems include, but are not limited to, mobile phones, tablets, base stations, network access points, customer-premises equipment (CPE), laptops, and wearable electronics.

SUMMARY

In certain embodiments, the present disclosure relates to a multipath filter. The multipath filter includes an input terminal configured to receive an input signal, an output terminal, and a first plurality of filter circuit branches electrically connected in parallel between the input terminal and the output terminal, each of the first plurality of filter circuit branches including a double-in double-switched downconverter configured to generate a downconverted signal by downconverting the input signal with a pair of clock signals of a common clock signal frequency but of different phases, a filter network configured to filter the downconverted signal to generate a filtered signal, and an upconverter configured to upconvert the filtered signal.

In a number of embodiments, the multipath filter is operable to attenuate a frequency component of the input signal at the common clock signal frequency.

In various embodiments, the multipath filter is operable to pass a frequency component of the input signal at about twice the common clock signal frequency.

In several embodiments, the multipath filter has a center frequency about equal to one-half of a product of a number of the first plurality of filter circuit branches and the common clock signal frequency.

In some embodiments, the first plurality of filter circuit branches are an integer N in number, the pair of clock signals of each of the first plurality of filter circuit branches separated in phase by about 720°/N.

In according with various embodiments, the upconverter of each of the first plurality of filter circuit branches receives a clock signal that is offset in phase from the pair of clocks signals.

In a number of embodiments, the clock signal of the upconverter has a phase that is about half way between a first phase and a second phase of the pair of clocks signals.

In various embodiments, each filter network of the first plurality of filter circuit branches includes a low pass filter.

In some embodiments, the multipath filter further includes a second plurality of filter circuit branches electrically connected in parallel with the first plurality of filter circuit branches, the second plurality of filter circuit branches configured to operate with a phase lag relative to the first plurality of circuit branches to thereby reduce a sideband power at the output terminal.

In a number of embodiments, each of the first plurality of filter circuit branches is implemented differentially.

In various embodiments, the double-in double-switched downconverter includes a first downconverting mixer and a second downconverting mixer electrically connected in parallel, the first downconverting mixer controlled by a first clock signal of the pair of clock signals, and the second downconverting mixer controlled by a second clock signal of the pair of clock signals.

In certain embodiments, the present disclosure relates to a packaged module. The packaged module includes a package substrate and a semiconductor die attached to the package substrate. The semiconductor die includes a multipath filter including an input terminal configured to receive an input signal, an output terminal, and a first plurality of filter circuit branches electrically connected in parallel between the input terminal and the output terminal. Each of the first plurality of filter circuit branches includes a double-in double-switched downconverter configured to generate a downconverted signal by downconverting the input signal with a pair of clock signals of a common clock signal frequency but of different phases, a filter network configured to filter the downconverted signal to generate a filtered signal, and an upconverter configured to upconvert the filtered signal.

In various embodiments, the multipath filter is operable to attenuate a frequency component of the input signal at the common clock signal frequency.

In several embodiments, the multipath filter is operable to pass a frequency component of the input signal at about twice the common clock signal frequency.

In a number of embodiments, the upconverter of each of the first plurality of filter circuit branches receives a clock signal that has a phase offset from phases of the pair of clocks signals.

In some embodiments, the first plurality of filter circuit branches includes an even number of at least four filter circuit branches.

In various embodiments, the semiconductor die further includes a second plurality of filter circuit branches electrically connected in parallel with the first plurality of filter circuit branches, the second plurality of filter circuit branches configured to operate with a phase lag relative to the first plurality of circuit branches to thereby reduce a sideband power at the output terminal.

In certain embodiments, the present disclosure relates to a mobile device. The mobile device includes an antenna and a front-end module electrically coupled to the antenna. The front-end module includes an input terminal configured to receive an input signal from the antenna, an output terminal configured to provide a filtered signal, and a first plurality of filter circuit branches electrically connected in parallel between the input terminal and the output terminal. Each of the first plurality of filter circuit branches includes a double-in double-switched downconverter configured to generate a downconverted signal by downconverting the input signal with a pair of clock signals of a common clock signal frequency but of different phases, a filter network configured to filter the downconverted signal to generate a filtered signal, and an upconverter configured to upconvert the filtered signal.

In a number of embodiments, the upconverter of each of the first plurality of filter circuit branches receives a clock signal that has a phase offset from phases of the pair of clocks signals.

In various embodiments, the front-end module further includes a second plurality of filter circuit branches electrically connected in parallel with the first plurality of filter circuit branches, the second plurality of filter circuit branches configured to operate with a phase lag relative to the first plurality of circuit branches to thereby reduce a sideband power at the output terminal.

In certain embodiments, the present disclosure relates to a multipath filter. The multipath filter includes an input terminal configured to receive an input signal, an output terminal, and a plurality of filter paths electrically connected in parallel between the input terminal and the output terminal. Each of the plurality of filters paths includes a double-in double-switched downconverter configured to generate a downconverted signal by downconverting the input signal with a pair of clock signals of a common clock signal frequency but of different phases, a filter network configured to filter the downconverted signal to generate a filtered signal, and an upconverter configured to upconvert the filtered signal.

In a number of embodiments, the multipath filter is operable to attenuate a frequency component of the input signal at the common clock signal frequency.

In various embodiments, the multipath filter is operable to pass a frequency component of the input signal at about twice the common clock signal frequency.

In several embodiments, a plurality of time instances at which the plurality of filter paths downconvert the input signal are staggered in time.

In a number of embodiments, the multipath filter has a center frequency about equal to one-half of a product of a number of the plurality of filter paths and the common clock signal frequency.

In some embodiments, the plurality of filter paths are an integer N in number, the pair of clock signals of each of the plurality of filter paths separated in phase by about 720°/N. In accordance with several embodiments, the pair of clock signals for a filter path k of the plurality of filter paths includes a first clock signal with a phase of about 360° (k−1)/N and a second clock signal with a phase of about 360° (k+1)/N.

In various embodiments, the upconverter of each of the plurality of filter paths receives a clock signal that is offset in phase from the pair of clocks signals.

In a number of embodiments, the clock signal of the upconverter has a phase that is about half way between a first phase and a second phase of the pair of clocks signals.

In several embodiments, each filter network of the plurality of filter paths includes a low pass filter.

In some embodiments, the plurality of filter paths includes an even number of at least four filters paths.

In various embodiments, each of the plurality of filter paths is implemented differentially.

In a number of embodiments, the double-in double-switched downconverter includes a first downconverting mixer and a second downconverting mixer electrically connected in parallel, the first downconverting mixer controlled by a first clock signal of the pair of clock signals, and the second downconverting mixer controlled by a second clock signal of the pair of clock signals. In accordance with several embodiments, the first downconverting mixer includes a first field-effect transistor including a gate that receives the first clock signal, and a second field-effect transistor including a gate that receives the second clock signal.

In certain embodiments, the present disclosure relates to a packaged module. The packaged module includes a package substrate, and a semiconductor die attached to the package substrate. The semiconductor die includes a multipath filter including an input terminal configured to receive an input signal, an output terminal, and a plurality of filter paths electrically connected in parallel between the input terminal and the output terminal. Each of the plurality of filters paths includes a double-in double-switched downconverter configured to generate a downconverted signal by downconverting the input signal with a pair of clock signals of a common clock signal frequency but of different phases, a filter network configured to filter the downconverted signal to generate a filtered signal, and an upconverter configured to upconvert the filtered signal.

In various embodiments, the multipath filter is operable to attenuate a frequency component of the input signal at the common clock signal frequency.

In a number of embodiments, the multipath filter is operable to pass a frequency component of the input signal at about twice the common clock signal frequency.

In several embodiments, a plurality of time instances at which the plurality of filter paths downconvert the input signal are staggered in time.

In various embodiments, the multipath filter has a center frequency about equal to one-half of a product of a number of the plurality of filter paths and the common clock signal frequency.

In some embodiments, the plurality of filter paths are an integer N in number, the pair of clock signals of each of the plurality of filter paths separated in phase by about 720°/N. According to several embodiments the pair of clock signals for a filter path k of the plurality of filter paths includes a first clock signal with a phase of about 360° (k−1)/N and a second clock signal with a phase of about 360° (k+1)/N.

In a number of embodiments, the upconverter of each of the plurality of filter paths receives a clock signal that has a phase offset from phases of the pair of clocks signals.

In various embodiments, the clock signal of the upconverter has a phase that is about half way between the phases of the pair of clocks signals.

In some embodiments, each filter network of the plurality of filter paths includes a low pass filter.

In a number of embodiments, the plurality of filter paths includes an even number of at least four filters paths.

In several embodiments, each of the plurality of filter paths is implemented differentially.

In some embodiments, the double-in double-switched downconverter includes a first downconverting mixer and a second downconverting mixer electrically connected in parallel, the first downconverting mixer controlled by a first clock signal of the pair of clock signals, and the second downconverting mixer controlled by a second clock signal of the pair of clock signals. According to several embodiments, the first downconverting mixer includes a first field-effect transistor including a gate that receives the first clock signal, and a second field-effect transistor including a gate that receives the second clock signal.

In certain embodiments, the present disclosure relates to a mobile device. The mobile device includes an antenna, and a front-end module electrically coupled to the antenna. The front-end module includes an input terminal configured to receive an input signal from the antenna, an output terminal configured to provide a filtered signal, and a plurality of filter paths electrically connected in parallel between the input terminal and the output terminal. Each of the plurality of filters paths includes a double-in double-switched downconverter configured to generate a downconverted signal by downconverting the input signal with a pair of clock signals of a common clock signal frequency but of different phases, a filter network configured to filter the downconverted signal to generate a filtered signal, and an upconverter configured to upconvert the filtered signal.

In various embodiments, the multipath filter is operable to attenuate a frequency component of the input signal at the common clock signal frequency.

In a number of embodiments, the multipath filter is operable to pass a frequency component of the input signal at about twice the common clock signal frequency.

In several embodiments, a plurality of time instances at which the plurality of filter paths downconvert the input signal are staggered in time.

In various embodiments, the multipath filter has a center frequency about equal to one-half of a product of a number of the plurality of filter paths and the common clock signal frequency. In accordance with several embodiments, the plurality of filter paths are an integer N in number, the pair of clock signals of each of the plurality of filter paths separated in phase by about 720°/N. According to a number of embodiments, the pair of clock signals for a filter path k of the plurality of filter paths includes a first clock signal with a phase of about 360° (k−1)/N and a second clock signal with a phase of about 360° (k+1)/N.

In several embodiments, the upconverter of each of the plurality of filter paths receives a clock signal that has a phase offset from phases of the pair of clocks signals.

In a number of embodiments, the clock signal of the upconverter has a phase that is about half way between the phases of the pair of clocks signals.

In some embodiments, each filter network of the plurality of filter paths includes a low pass filter.

In several embodiments, the plurality of filter paths includes an even number of at least four filters paths.

In various embodiments, each of the plurality of filter paths is implemented differentially.

In a number of embodiments, the double-in double-switched downconverter includes a first downconverting mixer and a second downconverting mixer electrically connected in parallel, the first downconverting mixer controlled by a first clock signal of the pair of clock signals, and the second downconverting mixer controlled by a second clock signal of the pair of clock signals.

In certain embodiments, the present disclosure relates to a multipath filter. The multipath filter includes an input terminal configured to receive a radio frequency signal, an output terminal, and a plurality of filter paths electrically connected in parallel between the input terminal and the output terminal and operable to filter the radio frequency signal. The plurality of filter paths includes a first filter path including a first double-in double-switched downconverter, a first filter network, and a first upconverter. The plurality of filter paths further includes a second filter path including a second double-in double-switched downconverter, a second filter network, and a second upconverter. The multipath filter further includes a clock generation circuit configured to generate a plurality of clock signal phases of a common clock signal frequency but of different phases, the plurality of clock signal phases operable to control the plurality of filter paths.

In some embodiments, the multipath filter is operable to attenuate a frequency component of the radio frequency signal at the common clock signal frequency.

In various embodiments, the multipath filter is operable to pass a frequency component of the radio frequency signal at about twice the common clock signal frequency.

In a number of embodiments, a plurality of time instances at which the plurality of filter paths downconvert the radio frequency signal are staggered in time.

In several embodiments, the multipath filter has a center frequency about equal to one-half of a product of a number of the plurality of filter paths and the common clock signal frequency.

In some embodiments, the plurality of filter paths are an integer N in number, the clock generation circuit operable to provide a filter path k of the N filter paths with a first downconversion clock signal with a phase of about 360° (k−1)/N and a second downconversion clock signal with a phase of about 360° (k+1)/N.

In various embodiments, the first filter network includes a first low pass filter, and the second filter network includes a second low pass filter.

In several embodiments, the plurality of filter paths further includes a third filter path including a third double-in double-switched downconverter, a third filter network, and a third upconverter, and a fourth filter path including a fourth double-in double-switched downconverter, a fourth filter network, and a fourth upconverter. According to a number of embodiments, each of the plurality of filter paths is implemented differentially.

In some embodiments, the first double-in double-switched downconverter includes a first downconverting mixer and a second downconverting mixer electrically connected in parallel.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
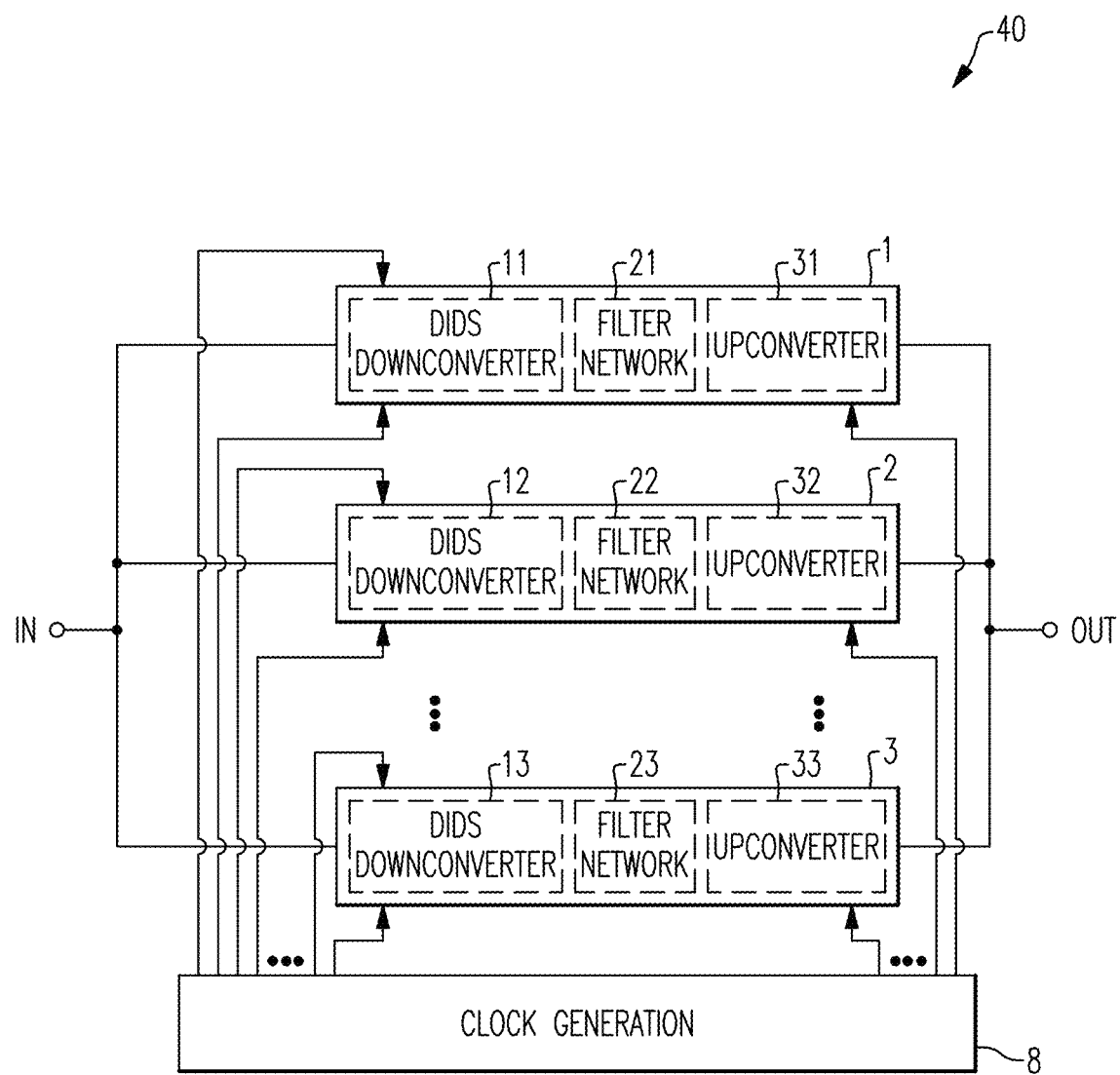
FIG. 1 is a schematic diagram of a multipath filter according to one embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Filters can be used to filter signals in radio frequency (RF) systems. For example, filters can be used to provide filtering of a wide variety of RF signals, including, but not limited to, wireless local area network (WLAN) signals, Bluetooth signals, and/or cellular signals. Filters can be used in a wide variety of applications, including, but not limited to, smartphones, base stations, handsets, and/or tablets.

Multipath filters are provided herein. In certain configurations, a multipath filter includes multiple filter paths or circuit branches that are electrically connected in parallel with one another between an input terminal and an output terminal. The input terminal receives an input signal, and each filter circuit branch includes a double-in double-switched (DIDS) downconverter that downconverts the input signal with two different clock signal phases to generate a downconverted signal. Each filter circuit branch further includes a filter network that generates a filtered signal by filtering the downconverted signal and an upconverter that upconverts the filtered signal to generate a branch output signal. Additionally, the branch output signals from the filter circuit branches are combined to generate an output signal at the output terminal.

The multipath filter operates with multiple clock signals of about the same frequency but different phases. Additionally, the clock signal frequency can be changed to control a center frequency of the multipath filter.

By using a DIDS downconverter in each filter circuit branch, the clock frequency corresponding to a given center frequency is relatively low. For example, in an implementation using N filter circuit branches, the clock frequency ($f_{ax}$) corresponding to a particular center frequency ($f_{CENTER}$) can be about equal to $(2/N)*f_{CENTER}$.

Thus, the teachings herein can be used to provide a filter (including, but not limited to, a bandpass filter) having a controllable center frequency and that operates with a relatively slow clock signal. By relaxing the timing constraints corresponding to a given center frequency, the filter can be implemented using reduced expense and/or complexity.

Each DIDS downconverter includes a pair of downconverting mixers that provide downconversion using out-of-phase clock signals. For example, in an implementation using N filter circuit branches, each DIDS downconverter can operate with a pair of clock signals that are about 720°/N apart in phase, where N is an integer corresponding to a number of the filter circuit branches. In one embodiment, a filter circuit branch k of the N filter circuit branches operates with a first clock signal having a phase of about 360° (k−1)/N and a second clock signal having a phase of about 360° (k+1)/N.

Accordingly, a multipath filter can sample the input signal twice over an interval of $T_{CLK}/N$, where Tax is the clock period. Additionally, each branch output signal is filtered over an interval of $T_{CLK}/N$. Furthermore, a 360°/N phase difference is provided between a downconverting mixer of one branch and a downconverting mixer of a successive branch, and a 720°/N phase difference is provided between a pair of downconverting mixers in the same filter circuit branch.

Using DIDS downconverters in the filter circuit branches aids in suppressing even order harmonics. Thus, the multipath filters herein can be used to attenuate out-of-band frequencies, while maintaining signal quality of in-band frequencies.

In contrast, a multipath filter that operates without DIDS downconverters can have a filter frequency response that includes additional selectivity at even and odd harmonics of the switching frequency. Additionally, such a filter's out-of-band frequency rejection is adversely affected by switching resistance, and the filter operates with a relatively high clock frequency to achieve a given center frequency. Accordingly, a multipath filter that operates without DIDS downconverters can have degraded harmonic performance, poor out-of-band rejection, and/or high cost and complexity.

Moreover, the multipath bandpass filters herein can exhibit improved out-of-band rejection even when switches used for frequency conversion have relatively high resistance.

In certain embodiments, the outputs of a pair of multipath filters with DIDS downconverters are combined to reduce or eliminate sideband power. For example, the outputs of two multipath filters with N paths and operating with a clock phase difference of 360°/(2N) can be combined to generate an output signal with substantially no signal component at a sideband frequency.

FIG. 1 is a schematic diagram of a multipath filter 40 according to one embodiment. The multipath filter 40 includes a first filter path or branch 1, a second filter circuit branch 2, a third filter circuit branch 3, and a clock generation circuit 8. As shown in FIG. 1, the filter circuit branches 1-3 are electrically connected in parallel with one another between an input terminal IN and an output terminal OUT. A filter circuit branch is also referred to herein as a filter path.

As indicated by ellipses, any suitable number of filter circuit branches can be included in the multipath filter 40. In one embodiment, a multipath filter includes an even number of at least 4 filter circuit branches.

As shown in FIG. 1, each of the filter circuit branches 1-3 includes a DIDS downconverter, a filter network, and an upconverter. For example, the first filter circuit branch 1 includes a first DIDS downconverter 11, a first filter network 21, and a first upconverter 31. Additionally, the second filter circuit branch 2 includes a second DIDS downconverter 12, a second filter network 22, and a second upconverter 32. Furthermore, the third filter circuit branch 3 includes a third DIDS downconverter 13, a third filter network 23, and a third upconverter 33.

With respect to each of the filter circuit branches 1-3, the branch's DIDS downconverter downconverters the input signal from the input terminal IN to generate a downconverted signal. Additionally, the branch's filter network filters the downconverted signal to generate a filtered signal, which in turn is upconverted using the branch's upconverter to generate a branch output signal. Additionally, the branch output signals are combined to generate an output signal at the output terminal OUT. A branch output signal is also referred to herein as a path output signal.

Each of the DIDS downconverters 11-13 provides downconversion using a pair of clock signals of about the same frequency (fax), but different phases. For example, the clock generation circuit 8 generates a first pair of downconversion clock signals for the DIDS downconverter 11, a second pair of downconversion clock signals for the second DIDS downconverter 12, and a third pair of downconversion clock signals for the third DIDS downconverter 13. The downconversion clock signals are of different phases, such that the time instances at which the DIDS downconverters 11-13 downconvert the input signal are staggered in time.

The clock generation circuit 8 can be implemented in a wide variety of ways, including, but not limited to, using digital circuitry (for instance, clock dividers), phase-locked loops (PLLs), multiphase oscillators, and/or polyphase filters. Although not illustrated in FIG. 1, in certain implementations the clock generation circuit 8 receives a reference clock signal.

In one embodiment, a multipath filter includes N filter circuit branches, and a filter circuit branch k of the N filter circuit branches includes a DIDS downconverter that operates with a first clock signal having a phase of about 360° (k−1)/N and a second clock having a phase of about 360° (k+1)/N.

The upconverters 31-33 can also operate with a clock signal frequency of about fax, but with different phases from one another. The clock phase of a given upconverter is offset in phase from the clock signal phases of a corresponding DIDS converter. Implementing a filter circuit branch in this manner aids in providing sufficient time for the node voltages of the filter circuit branch to settle (for instance, to provide sufficient time for capacitors to charge or discharge). In one embodiment, a multipath filter includes N filter circuit branches, and a filter circuit branch k of the N filter circuit branches includes an upconverter that operates with a phase of about 360° (k/N).

The filter networks 21-23 are implemented to control a frequency response of the multipath filter. For example, by implementing the filter networks 21-23 as low pass filters with corner frequency $f_c$ can operate the multipath filter 40 as a bandpass filter with a passband that is about equal to $2*f_c$.

The filter networks 21-23 can be implemented in a wide variety of ways, including but not limited to, using single order filters, higher order filters, passive filters, active filters, and/or switched capacitor filters.

The multipath filter 40 operates with superior even harmonic suppression performance.

For example, using the DIDS filters 11-13 reduces or eliminates even order harmonics, thereby significantly improving the performance of the filter. The even order harmonic suppression is achieved with lower cost and/or higher performance relative to a fully differential implementation.

The multipath filter 40 also provides a desired center frequency ($f_{CENTER}$) using a relatively slow clock signal frequency ($f_{CLK}$) for upconversion and downconversion. For example, in certain implementations, $f_{CENTER}$ is about equal to $(N/2)f_{CLK}$.

Lowering a frequency of fax provides a number of advantages, including, for example, reduced complexity and/or cost of the clock generation circuit 8. For example, the clock generation circuit 8 can generate non-overlapping clock signals of about the same frequency but of different phases. By reducing clocking constraints, the filter 40 can be cheaper, faster, and/or easier to manufacture.

Figure 2A:
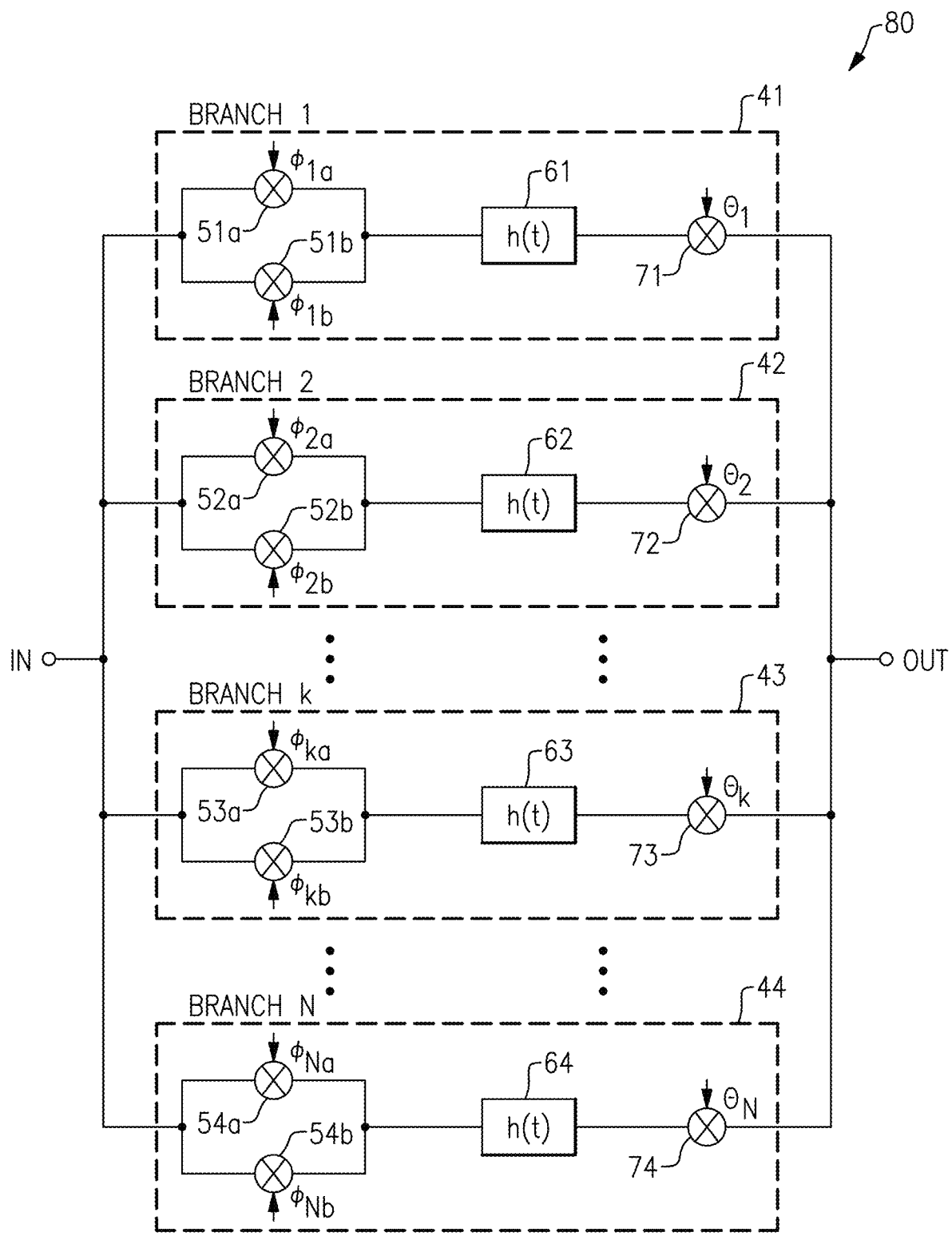
FIG. 2A is a schematic diagram of a multipath filter according to another embodiment.

FIG. 2A is a schematic diagram of a multipath filter 80 according to another embodiment. The multipath filter 80 includes a first filter circuit branch 41, a second filter circuit branch 42, a kth filter circuit branch 43, and an Nth filter circuit branch 44. The filter circuit branches 41-44 are electrically connected in parallel with one another between the input terminal IN and the output terminal OUT.

The first filter circuit branch 41 includes a first DIDS downconverter implemented using a first downconverting mixer 51a and a second downconverting mixer 51b that are in parallel with one another and operate with clock signal phases $\phi_{1a}$ and $\phi_{1b}$, respectively. The first filter circuit branch 41 further includes a filter network 61 with linear time invariant transfer function h(t), and an upconverting mixer 71 that operates with clock signal phase $\theta_1$.

With continuing reference to FIG. 2A, the second filter circuit branch 42 includes a second DIDS downconverter implemented using a first downconverting mixer 52a and a second downconverting mixer 52b that are in parallel with one another and operate with clock signal phases $\phi_{2a}$ and $\phi_{2b}$, respectively. The second filter circuit branch 42 further includes a filter network 62 with transfer function h(t), and an upconverting mixer 72 that operates with clock signal phase $\theta_2$.

The kth filter circuit branch 43 further includes a kth DIDS downconverter implemented using a first downconverting mixer 53a and a second downconverting mixer 53b that are in parallel with one another and operate with clock signal phases $\phi_{ka}$ and $\phi_{kb}$, respectively. The kth filter circuit branch 43 further includes a filter network 63 with transfer function h(t), and an upconverting mixer 73 that operates with clock signal phase $\theta_k$.

With continuing reference to FIG. 2A, the Nth filter circuit branch 44 further includes an Nth DIDS downconverter implemented using a first downconverting mixer 54a and a second downconverting mixer 54b that are in parallel with one another and operate with clock signal phases $\phi_{Na}$ and $\phi_{Nb}$, respectively. The Nth filter circuit branch 44 further includes a filter network 64 with transfer function h(t), and an upconverting mixer 74 that operates with clock signal phase $\theta_N$.

Figure 2B:
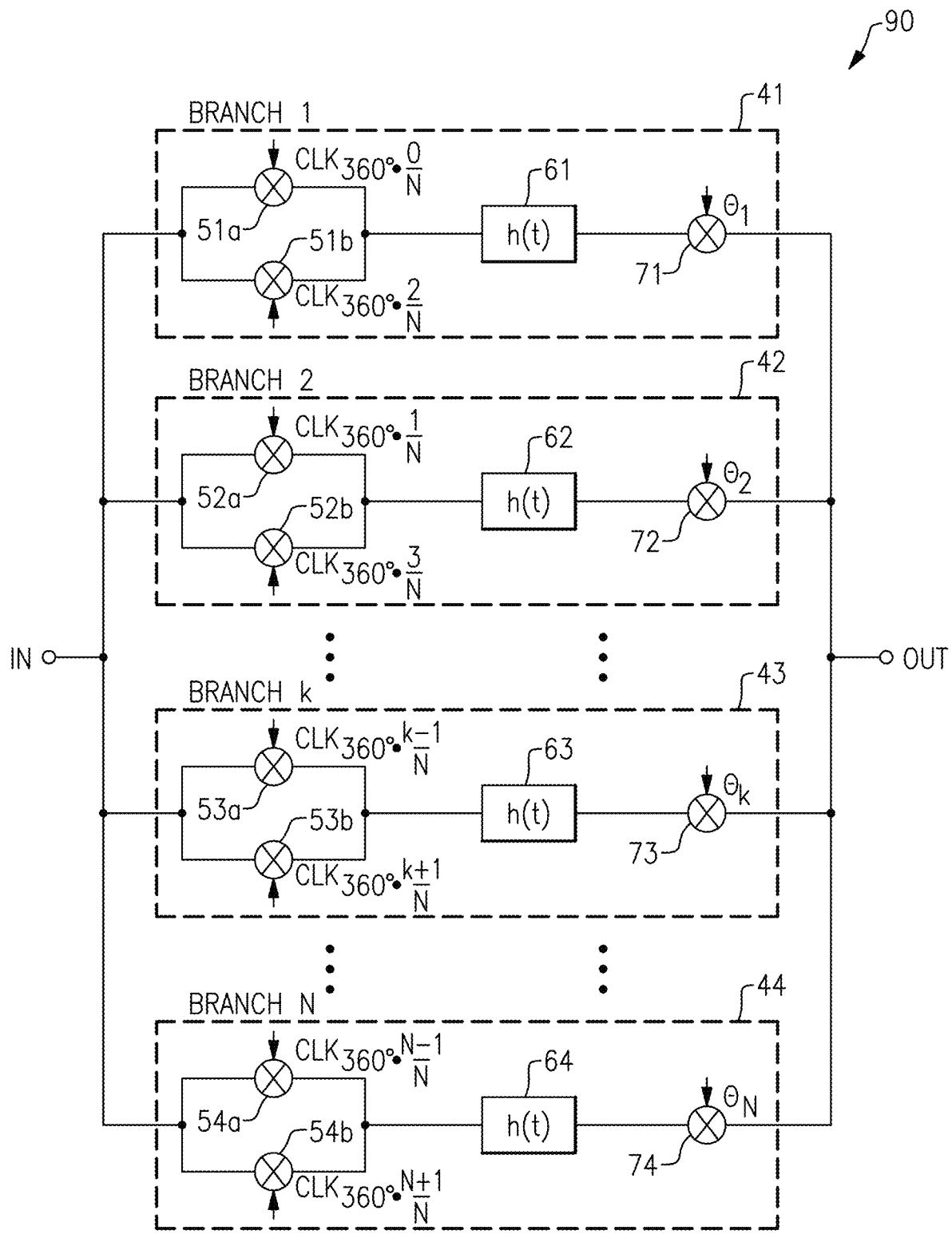
FIG. 2B is a schematic diagram of a multipath filter according to another embodiment.

FIG. 2B is a schematic diagram of a multipath filter 90 according to another embodiment. The multipath filter 90 of FIG. 2B is similar to the multipath filter 80 of FIG. 2A, except the multipath filter 90 illustrates specific clock signal phases for the downconverting mixers of the filter circuit branches 41-44.

In particular, the downconverting mixers 51a and 51b of the first filter circuit branch 41 operate with clock signal phases 360° (0/N) and 360° (2/N), respectively. Additionally, the downconverting mixers 52a and 52b of the second filter circuit branch 42 operate with clock signal phases 360° (1/N) and 360° (3/N), respectively. Furthermore, the downconverting mixers 53a and 53b of the kth filter circuit branch 43 operate with clock signal phases 360° (k−1)/N and 360° (k+1)/N, respectively. Additionally, the downconverting mixers 54a and 54b of the Nth filter circuit branch 44 operate with clock signal phases 360° (N−1)/N and 360° (N+1)/N, respectively.

Figure 2C:
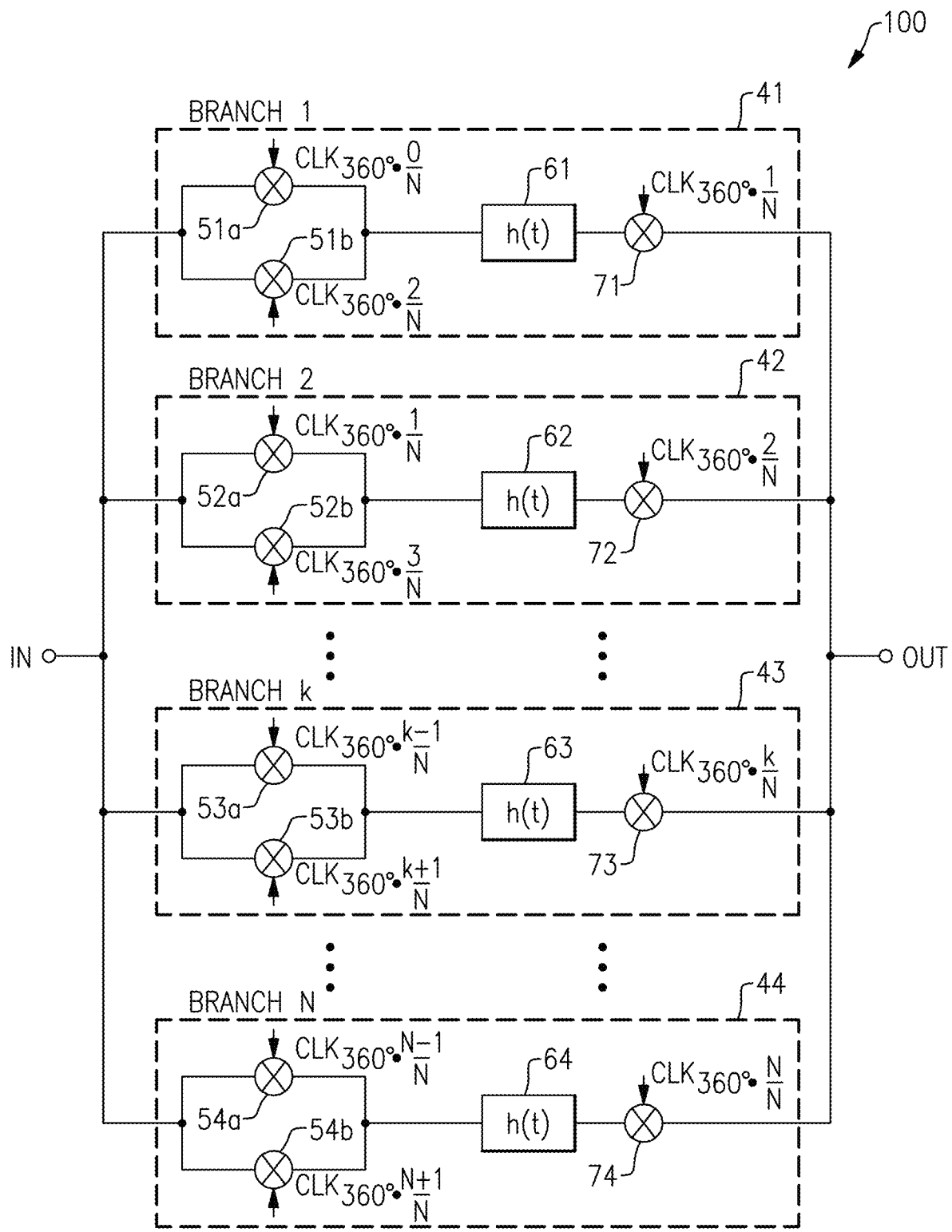
FIG. 2C is a schematic diagram of a multipath filter according to another embodiment.

FIG. 2C is a schematic diagram of a multipath filter 100 according to another embodiment. The multipath filter 100 of FIG. 2C is similar to the multipath filter 90 of FIG. 2B, except the multipath filter 100 illustrates specific clock signal phases for the upconverting mixers of the filter circuit branches 41-44.

In particular, the upconverting mixer 71 of the first filter circuit branch 41 operates with clock signal phase 360° (1/N). Additionally, the upconverting mixer 72 of the second filter circuit branch 42 operates with clock signal phase 360° (2/N). Furthermore, the upconverting mixer 73 of the kth filter circuit branch 43 operates with clock signal phase 360° (k/N). Additionally, the upconverting mixer 74 of the Nth filter circuit branch 44 operates with clock signal phase 360° (N/N). In this embodiment, each upconverting mixer operates with a clock signal phase that is about half way between the pair of clock signal phases of a corresponding DIDS downconverter.

Figure 3A:
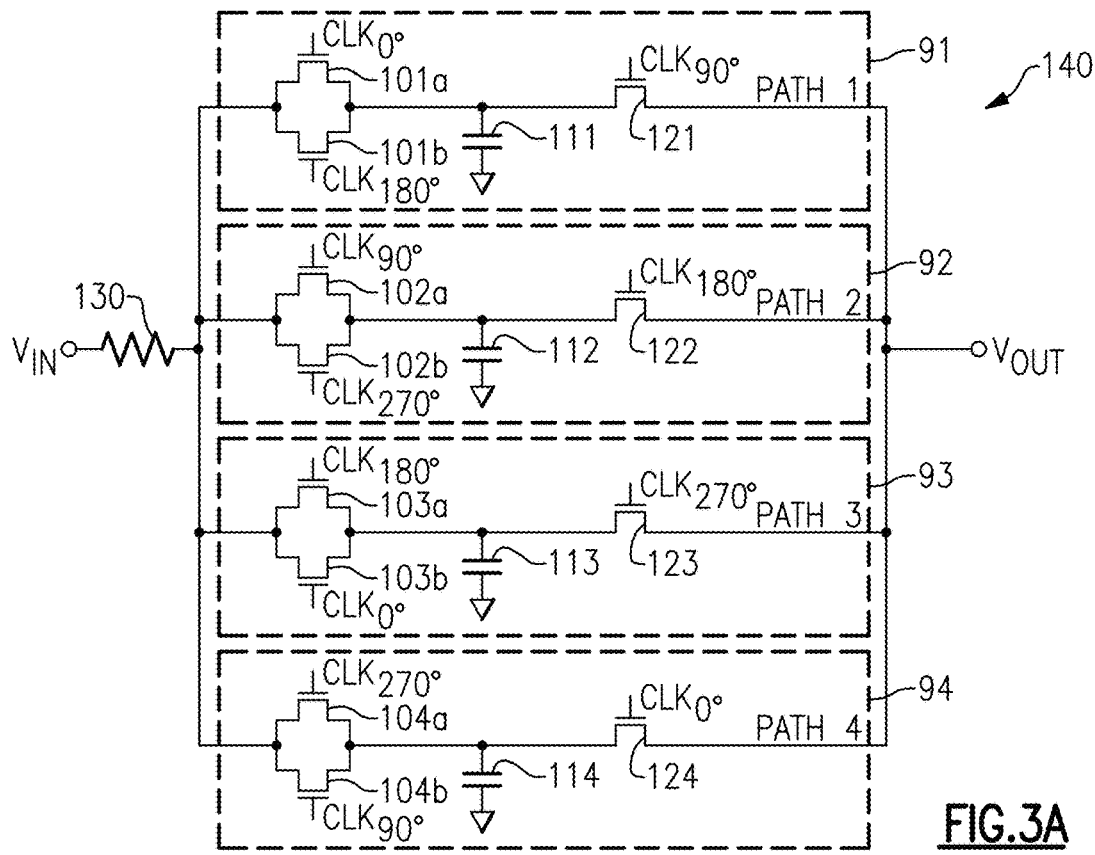
FIG. 3A is a circuit diagram of a multipath filter according to one embodiment.

FIG. 3A is a circuit diagram of a multipath filter 140 according to one embodiment. The multipath filter 140 includes a first filter circuit branch 91, a second filter circuit branch 92, a third filter circuit branch 93, a fourth filter circuit branch 94, and a shared input resistor 130. Each of the filter circuit branches 91-94 includes an input electrically connected to a voltage input terminal $V_{IN}$ via the shared input resistor 130. Additionally, each of the filter circuit branches 91-94 includes an output electrically connected to a voltage output terminal $V_{OUT}$.

Although an example with four filter circuit branches is shown, the teachings herein are applicable to multipath filters using more or fewer filter circuit branches. Additionally, although a specific implementation of filter circuit branch circuitry is shown, the teachings herein are applicable to filter paths or branches implemented in a wide variety of ways. Accordingly, other implementations are possible.

The first filter circuit branch 91 includes a first input switch field-effect transistor (FET) 101a and a second input switch FET 101b that are electrically connected in parallel with one another and receive clock signal phases of about 0° and about 180°, respectively. Additionally, the first filter circuit branch 91 includes a shunt filter capacitor 111 and an output switch FET 121 that operates with a clock signal phase of about 90°.

With continuing reference to FIG. 3A, the second filter circuit branch 92 includes a first input switch FET 102a and a second input switch FET 102b that are electrically connected in parallel with one another and receive clock signal phases of about 90° and about 270°, respectively. Additionally, the second filter circuit branch 92 includes a shunt filter capacitor 112 and an output switch FET 122 that operates with a clock signal phase of about 180°.

The third filter circuit branch 93 includes a first input switch FET 103a and a second input switch FET 103b that are electrically connected in parallel with one another and receive clock signal phases of about 180° and about 0°, respectively. Additionally, the third filter circuit branch 93 includes a shunt filter capacitor 113 and an output switch FET 123 that operates with a clock signal phase of about 270°.

With continuing reference to FIG. 3A, the fourth filter circuit branch 94 includes a first input switch FET 104a and a second input switch FET 104b that are electrically connected in parallel with one another and receive clock signal phases of about 270° and about 90°, respectively. Additionally, the fourth filter circuit branch 94 includes a shunt filter capacitor 114 and an output switch FET 124 that operates with a clock signal phase of about 0°.

The illustrated multipath filter 140 includes filter networks that provide a first-order low pass filter. Additionally, the filter network of each of the filter circuit branches 131-134 is implemented using a shunt capacitor, and a shared input resistor 130 operates in combination with each of the shunt capacitors to provide low pass filtering.

Sharing the input resistor 130 or other circuitry across branches can reduce component count and/or path-to-path variation. However, other implementations are possible.

Figure 3B:
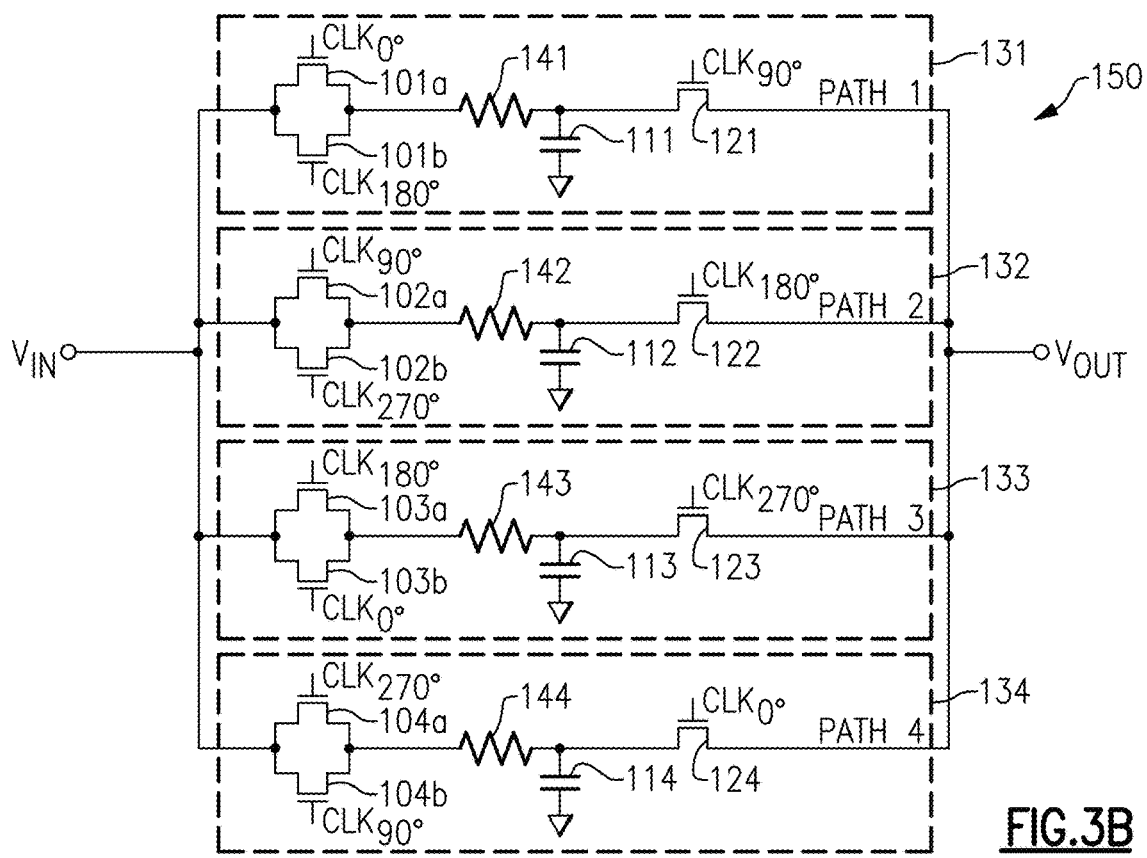
FIG. 3B is a circuit diagram of a multipath filter according to another embodiment.

FIG. 3B is a circuit diagram of a multipath filter 150 according to another embodiment. The multipath filter 150 of FIG. 3B is similar to the multipath filter 140 of FIG. 3A, except that the multipath filter 150 omits a shared input resistor in favor of using separate resistors in each filter circuit branch. For example, as shown in FIG. 3B, the filter circuit branches 131-134 include filter resistors 141-144, respectively.

Figure 3C:
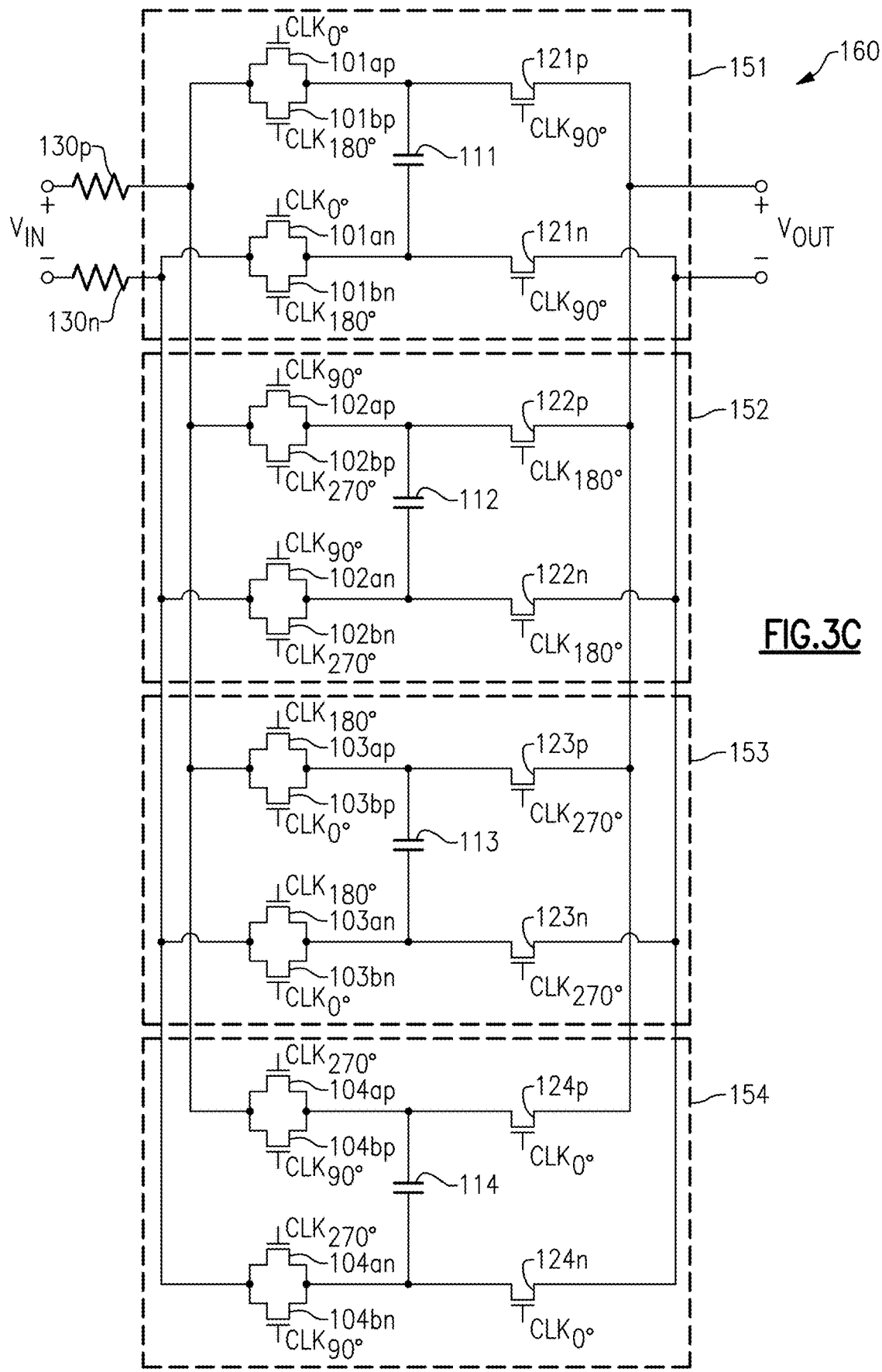
FIG. 3C is a circuit diagram of a multipath filter according to another embodiment.

FIG. 3C is a circuit diagram of a multipath filter 160 according to another embodiment. The multipath filter 160 of FIG. 3C is similar to the multipath filter 140 of FIG. 3A, except that the multipath filter 160 is implemented using differential filter circuit branches. For example, the multipath filter 160 includes first to fourth differential filter circuit branches 151-154, respectively.

Implementing a multipath filter using differential filter circuit branches can further enhance performance with respect to suppressing even order harmonics. Although FIG. 3C illustrates one example of a multipath filter implemented with differential filter circuit branches, any of the multipath filters described herein can be implemented differentially.

Figure 4A:
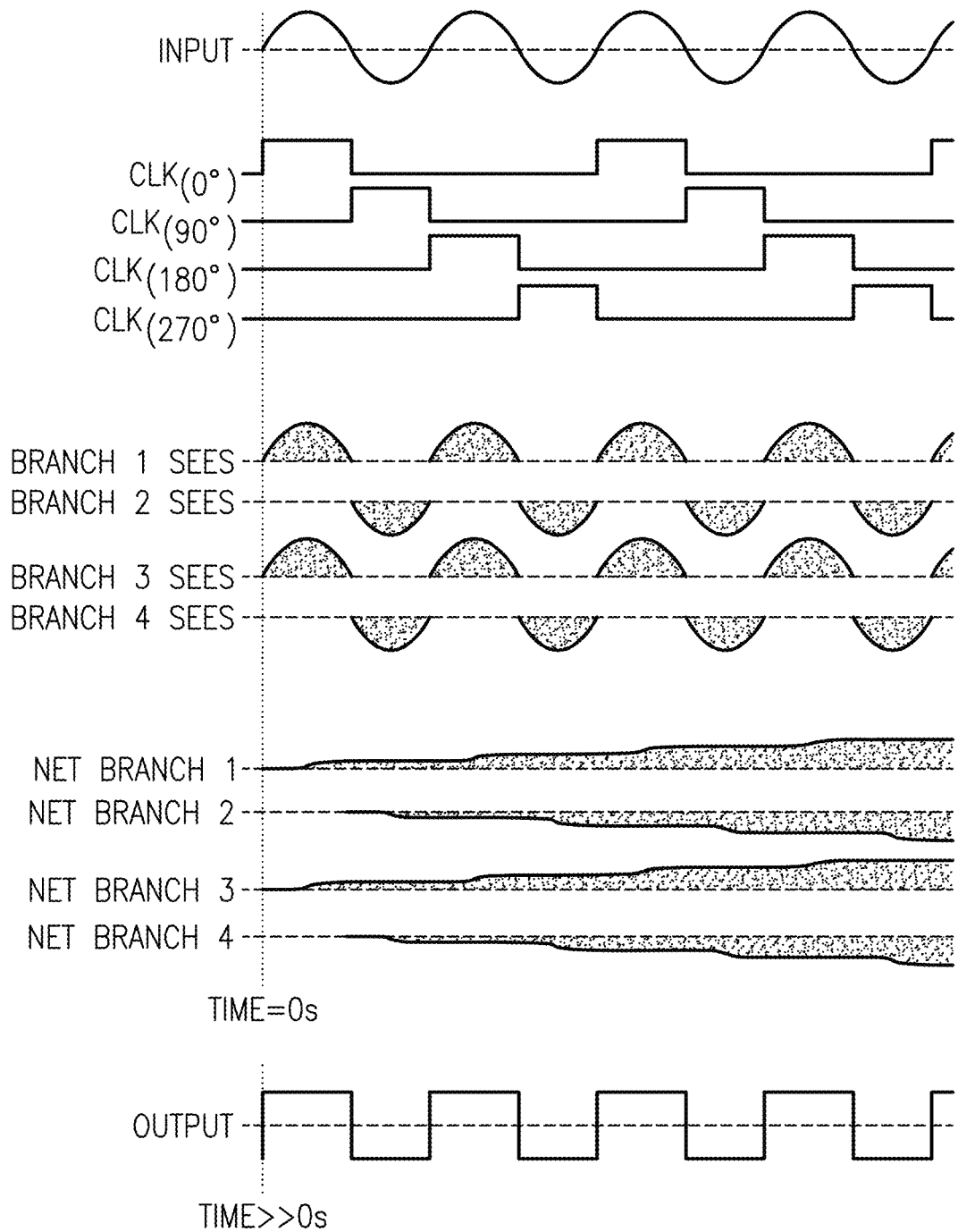
FIG. 4A is a graph of a response of a multipath filter to an input signal tone of about twice the clock signal frequency according to one embodiment.

FIG. 4A is a graph of a response of a multipath filter to an input signal tone of about twice the clock signal frequency according to one embodiment. The graph corresponds to one simulation of the multipath filter 140 of FIG. 3A.

As shown in FIG. 4A, the input signal tone of about twice the clock signal frequency is in the passband of the multipath filter. For example, in certain implementations, a multipath filter is implemented with a center frequency $f_{CENTER}$ about equal to $(N/2)f_{CLK}$.

For example, in the illustrated simulation, branch 1 and branch 3 see a first half of the signal cycle (corresponding to positive sinusoidal values of the input signal tone, in this example). Additionally, branch 2 and branch 4 see a second half of the signal cycle (corresponding to negative sinusoidal values of the input signal tone, in this example). Accordingly, each branch sees half of the signal cycle. Additionally, the net voltage stored in the filter networks of branch 1 and branch 3 increases, and the net voltage stored in the filter networks of branches 2 and 4 decreases, until the filter is substantially stable with respect to node voltages.

Figure 4B:
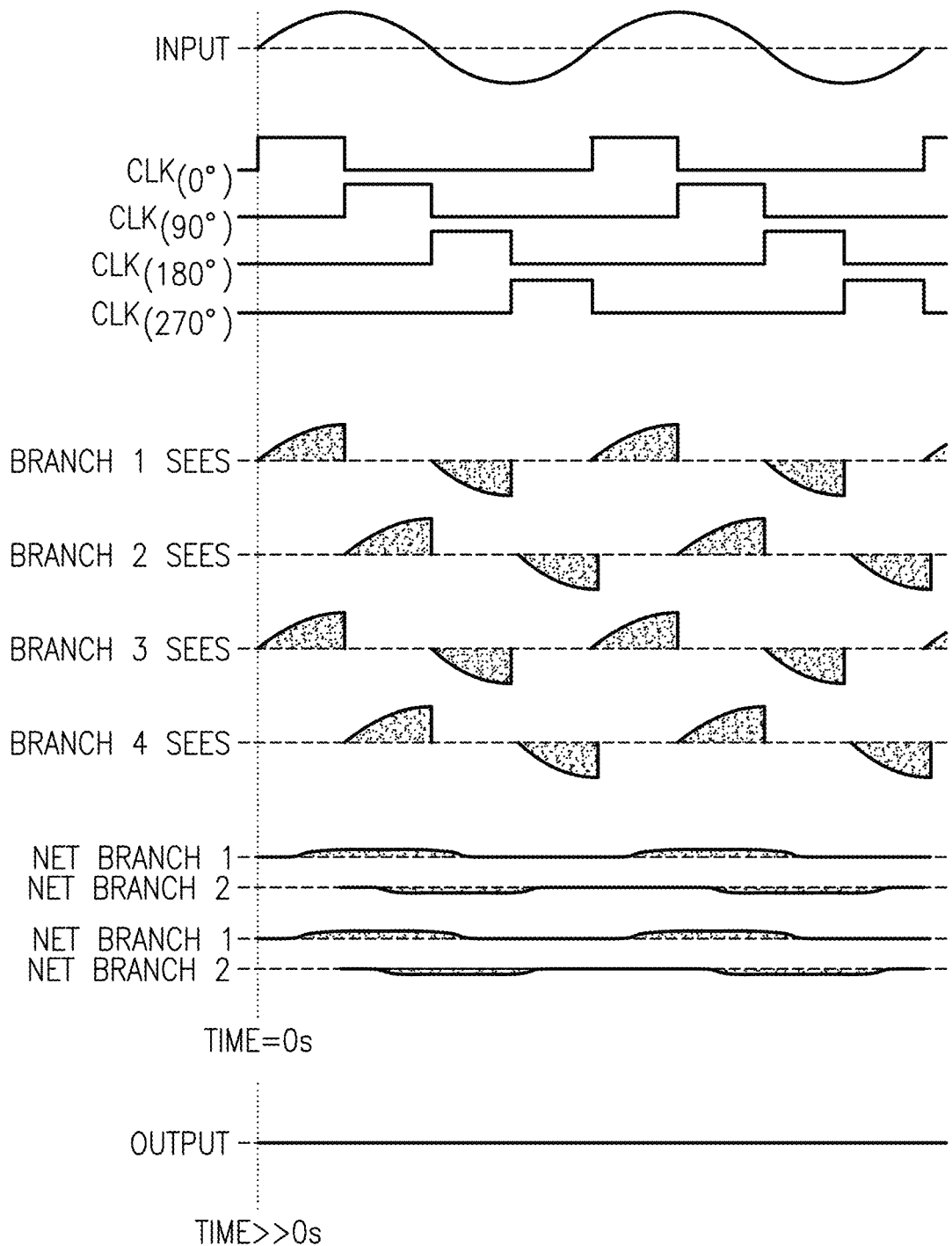
FIG. 4B is a graph of one example of a response of a multipath filter in response to an input signal tone of about the clock signal frequency.

FIG. 4B is a graph of one example of a response of a multipath filter in response to an input signal tone of about the clock signal frequency. The graph corresponds to one simulation of the multipath filter 140 of FIG. 3A.

As shown in FIG. 4B, the input signal tone that is about equal to the clock signal frequency is outside of the passband of the multipath filter, and thus is attenuated.

For example, branch 1 and branch 3 see a positive quarter and a negative quarter of the signal cycle. Thus, over the course of one signal cycle, branch 1 and branch 3 each see signals of opposite polarity, and thus cancel the sampled voltage. Similarly, branch 2 and branch 4 see a positive quarter and a negative quarter of the signal cycle. Thus, over the course of one signal cycle, branch 2 and branch 4 each see signals of opposite polarity, and thus cancel the sampled voltage. Accordingly, all branches have substantially zero net voltage and the filter outputs substantially no signal.

Figure 4C:
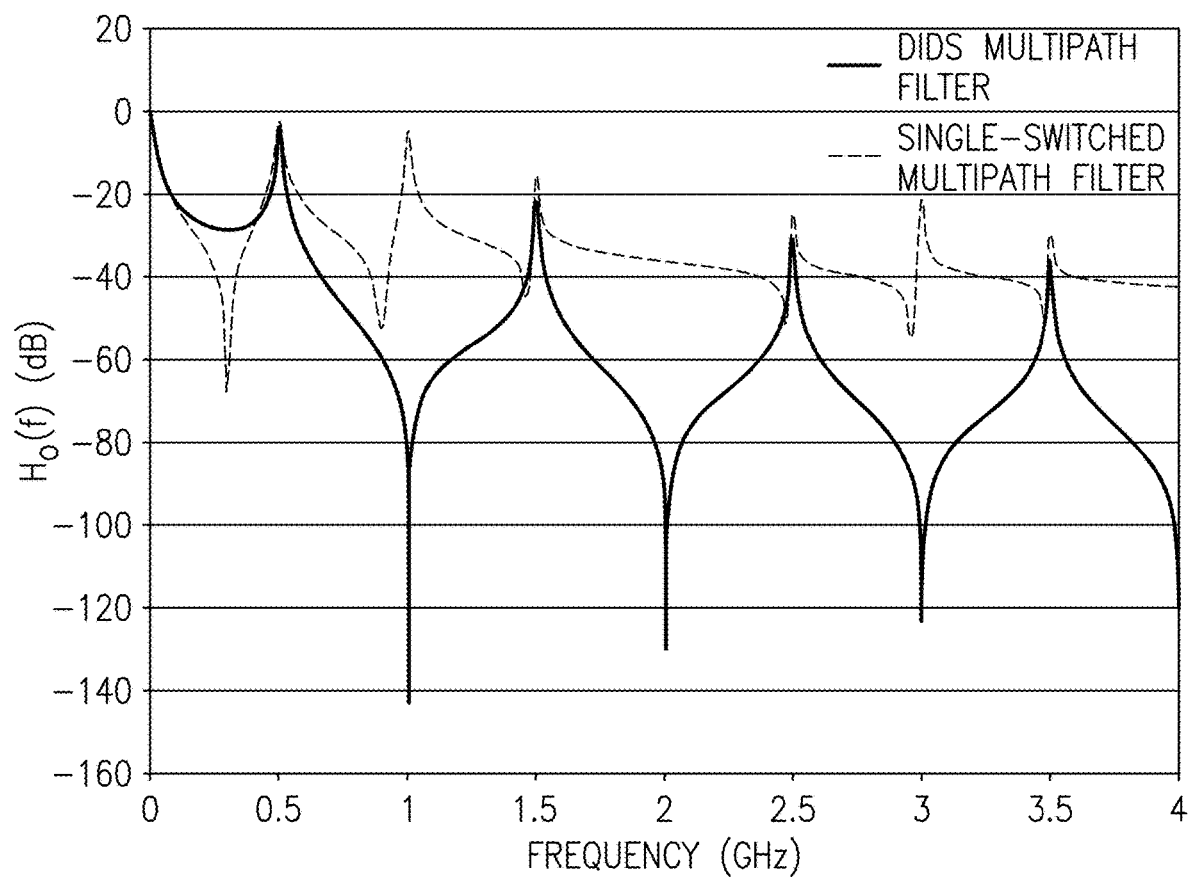
FIG. 4C is a graph of gain versus frequency for two examples of multipath filters.

FIG. 4C is a graph of gain versus frequency for two examples of multipath filters. The graph includes a first plot of gain versus frequency for a multipath filter in which each filter circuit branch includes a DIDS downconverter, and a second plot of gain versus frequency in which a single switched downconverter is used in each filter circuit branch.

As shown in FIG. 4C, the performance with respect to suppressing even harmonics is superior when each filter circuit branch includes a DIDS downconverter relative to when each filter circuit branch includes a single switched downconverter.

Figure 5:
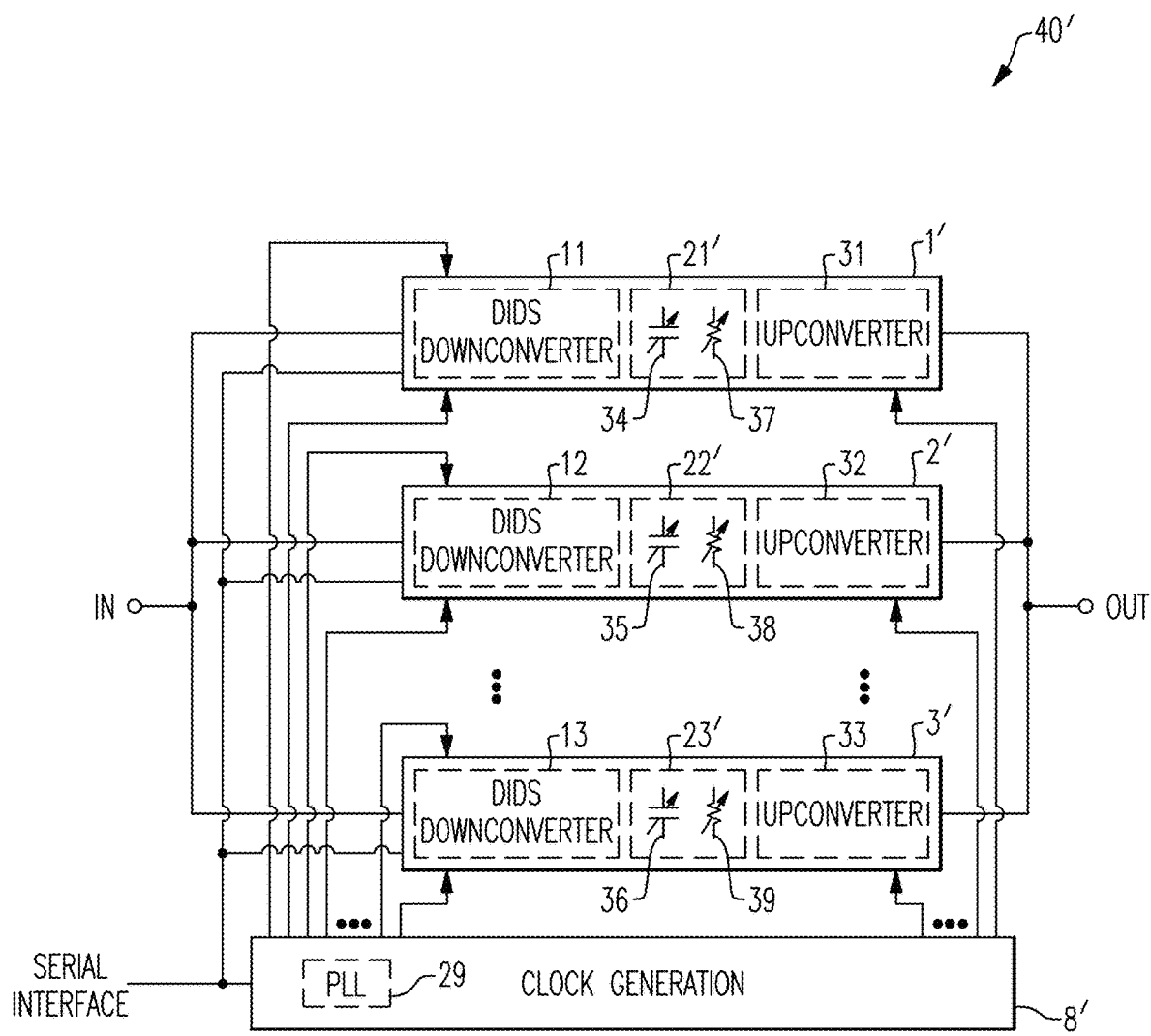
FIG. 5 is a schematic diagram of a multipath filter according to another embodiment.

FIG. 5 is a schematic diagram of a multipath filter 40' according to another embodiment. The multipath filter 40' includes a first filter circuit branch 1', a second filter circuit branch 2', a third filter circuit branch 3', and a clock generation circuit 8'. The filter circuit branches 1'-3' are electrically connected in parallel with one another between an input terminal IN and an output terminal OUT. Although three filter circuit branches are shown, any suitable number of filter circuit branches can be included.

As shown in FIG. 5, the filter circuit branches 1'-3' and the clock generation circuit 8' are connected to a serial interface, which can be used to provide data for controlling various filtering characteristics of the multipath filter 40'. In one embodiment, a transceiver or radio frequency integrated circuit (RFIC) controls data programmed over the serial interface.

The multipath filter 40' of FIG. 5 is similar to the multipath filter 40 of FIG. 1, except that the multipath filter 40' is implemented with variable filter circuitry such that one or more of the filter's filtering characteristics are configurable. For example, the first filter circuit branch 1' includes a first DIDS downconverter 11, a first variable filter network 21', and a first upconverter 31. Additionally, the second filter circuit branch 2' includes a second DIDS downconverter 12, a second variable filter network 22', and a second upconverter 32. Furthermore, the third filter circuit branch 3' includes a third DIDS downconverter 13, a third variable filter network 23', and a third upconverter 33.

In certain implementations, the variable filter networks 21'-23' include one or more circuit components (for instance, variable resistors 34-36 and/or variable capacitors 37-39) that are tunable and/or programmable to provide control over the frequency characteristics of the filter networks. In certain configurations, the variable filter networks 21'-23' are controllable by data received over the serial interface.

As shown in FIG. 5, the clock generation circuit 8' includes a PLL 29, which can be used to generate the clock signals for controlling the filter circuit branches 21'-23'. In certain configurations, the output clock frequency of the PLL 29 is controlled by data received over the serial interface, thereby providing programmability of the frequency characteristics of the multipath filter 40'. For instance, the data can control divisor values of a feedback divider of the PLL 29 to thereby control output clock frequency relative to a frequency of a reference clock signal $CLK_{REF}$.

The serial interface can be implemented in a wide variety of ways. In certain implementations, the serial interface corresponds to a mobile industry processor interface radio frequency front-end (MIPI RFFE) bus, an inter-integrated circuit (I²C) bus, or any other suitable interface or bus.

Figure 6:
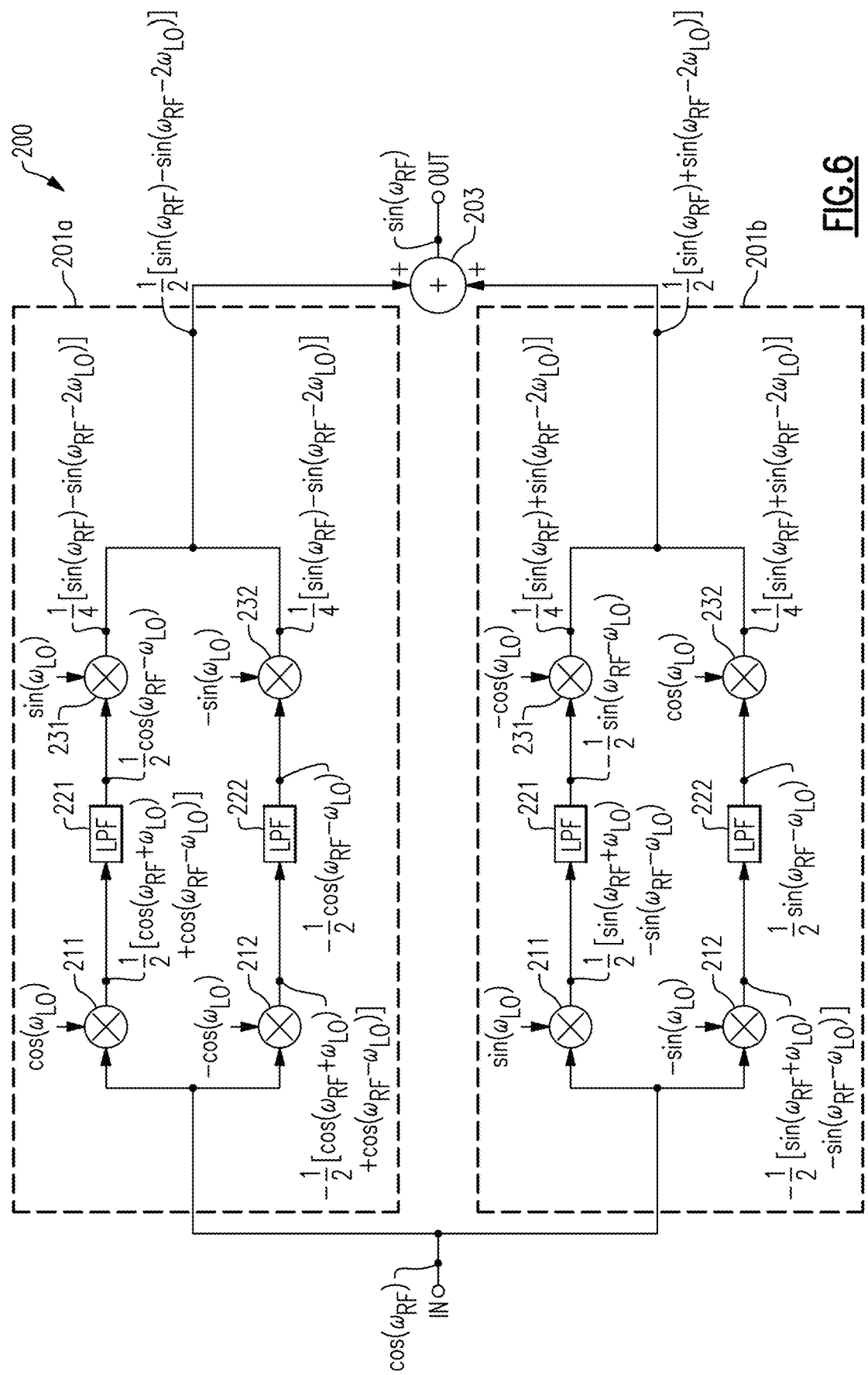
FIG. 6 is a schematic diagram of one embodiment of a multipath filter system with sideband rejection.

FIG. 6 is a schematic diagram of one embodiment of a multipath filter system 200 with sideband rejection. The multipath filter system 200 includes a first multipath filter 201a, a second multipath filter 201b, and a signal combiner 203.

The first multipath filter 201a includes a first filter circuit branch with a cascade of a first downconverter 211, a first low pass filter 221, and a first upconverter 231. As shown in FIG. 6, the first downconverter 211 operates with a clock signal $\cos(\omega_{LO})$, and the first upconverter 231 operates with a clock signal $\sin(\omega_{LO})$. The first multipath filter 201a further includes a second filter circuit branch with a cascade of a second downconverter 212, a second low pass filter 222, and a second upconverter 232. As shown in FIG. 6, the second downconverter 212 operates with a clock signal $-\cos(\omega_{LO})$, and the second upconverter 232 operates with a clock signal $-\sin(\omega_{LO})$.

The second multipath filter 201b includes a first filter circuit branch with a cascade of a first downconverter 211, a first low pass filter 221, and a first upconverter 231. As shown in FIG. 6, the first downconverter 211 operates with a clock signal $\sin(\omega_{LO})$, and the first upconverter 231 operates with a clock signal $-\cos(\omega_{LO})$. The second multipath filter 201b further includes a second filter circuit branch with a cascade of a second downconverter 212, a second low pass filter 222, and a second upconverter 232. As shown in FIG. 6, the second downconverter 212 operates with a clock signal $-\sin(\omega_{LO})$, and the second upconverter 232 operates with a clock signal $\cos(\omega_{LO})$.

As shown in FIG. 6, the first multipath filter 201a and the second multipath filter 201b are electrically connected in parallel between the input terminal IN and the output terminal OUT. In the illustrated embodiment, an explicit signal combiner 203 adds or combines the output signals from each of the multipath filters. Although shown as an explicit combiner, in certain implementations the output signals from the multipath filters are combined without an explicit structure for combining. For instance, currents from two multipath filters can be added by combining the currents at a node, thereby generating a summed current.

Various examples signals values have been annotated in FIG. 6 for the case where the input terminal IN receives an input signal tone $\cos(\omega_{RF})$.

As shown in FIG. 6, the first multipath filter 201a has an output signal that includes not only a desired signal component at frequency $\omega_{RF}$, but also an undesired sideband power at frequency $(\omega_{RF}-2\omega_{LO})$. Additionally, the second multipath filter 201b also has an output signal that includes not only a desired signal component at frequency $\omega_{RF}$, but also an undesired sideband power at frequency $(\omega_{RF}-2\omega_{LO})$.

In the illustrated embodiment, the clock signal phases used for downconversion and upconversion have been shifted in the second multipath filter 201b relative to the first multipath filter 201a. By shifting the phases in this manner, the sideband powers of the first multipath filter 201a and the second multipath filter 201b combine destructively such that the output signal at the output terminal OUT has substantially no signal component at the sideband frequency.

In certain embodiments herein, the outputs of two or more multipath filters are combined to reduce or eliminate sideband power. Such multipath filter systems are referred to herein as providing sideband rejection.

Figure 7:
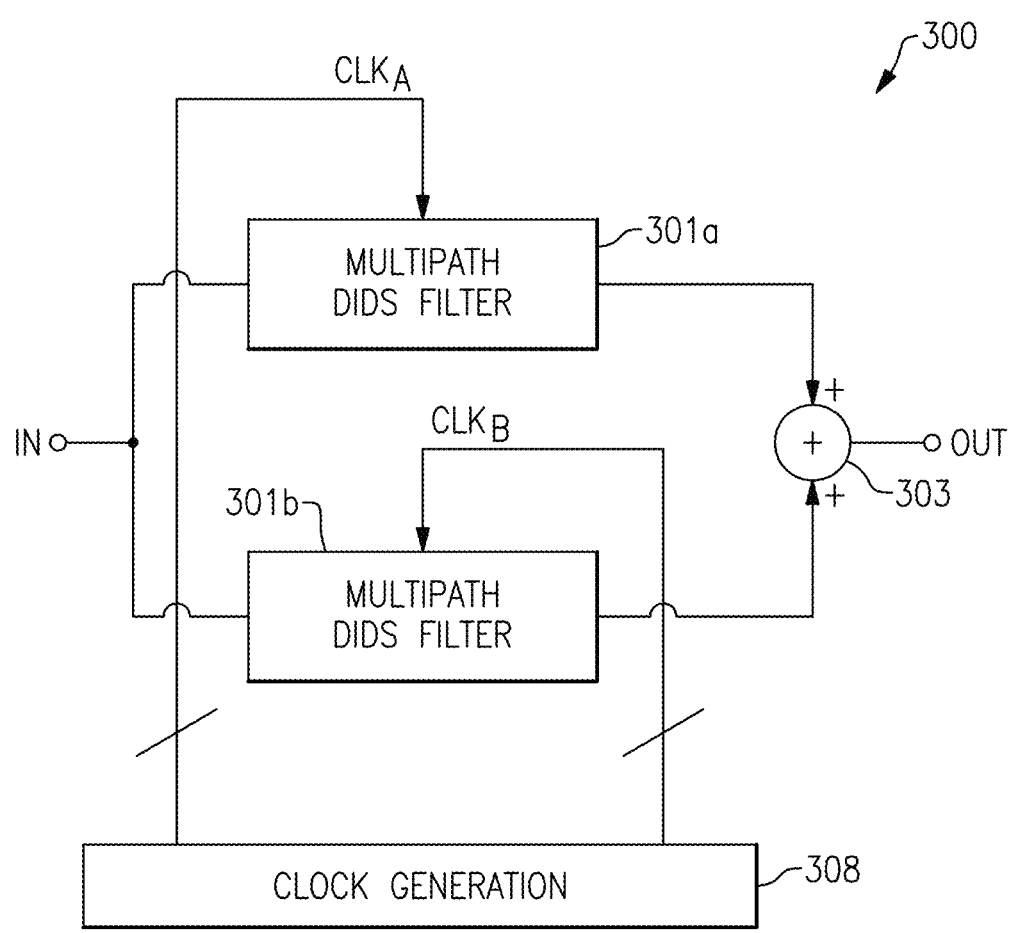
FIG. 7 is a schematic diagram of another embodiment of a multipath filter system with sideband rejection.

FIG. 7 is a schematic diagram of another embodiment of a multipath filter system 300 with sideband rejection. The multipath filter system 300 includes a first multipath filter 301a with DIDS downconversion, a second multipath filter 301b with DIDS downconversion, a combiner 303, and a clock generation circuit 308. The first multipath filter 301a and the second multipath filter 301b are electrically connected in parallel with one another between an input terminal IN and an output terminal OUT. Additionally, the combiner 303 adds or combines the output signals from each of the multipath filters. In certain implementations, the combiner 303 is omitted.

In the illustrated embodiment, the first multipath filter 301a includes N paths in parallel, and receives a first group of clock signals ($CLK_A$). Additionally, the second multipath filter 301b includes N paths in parallel, and receives a second group of clock signals ($CLK_B$). Each of the clock signals in the second group ($CLK_B$) lags a corresponding one of the clock signals in the first group ($CLK_A$) by 360°/(2N).

By implementing the clock phases in this manner, the output signal of the first multipath filter 301a combines with the output signal of the second multipath filter 301b in a manner that reduces or eliminates sideband power.

In certain embodiments, the first multipath filter 301a and the second multipath filter 301b are substantially identical except that the clock signals of the second multipath filter 301b lag the clock signals of the first multipath filter 301a so as to reduce or eliminate sideband power at the output terminal OUT.

Figure 8:
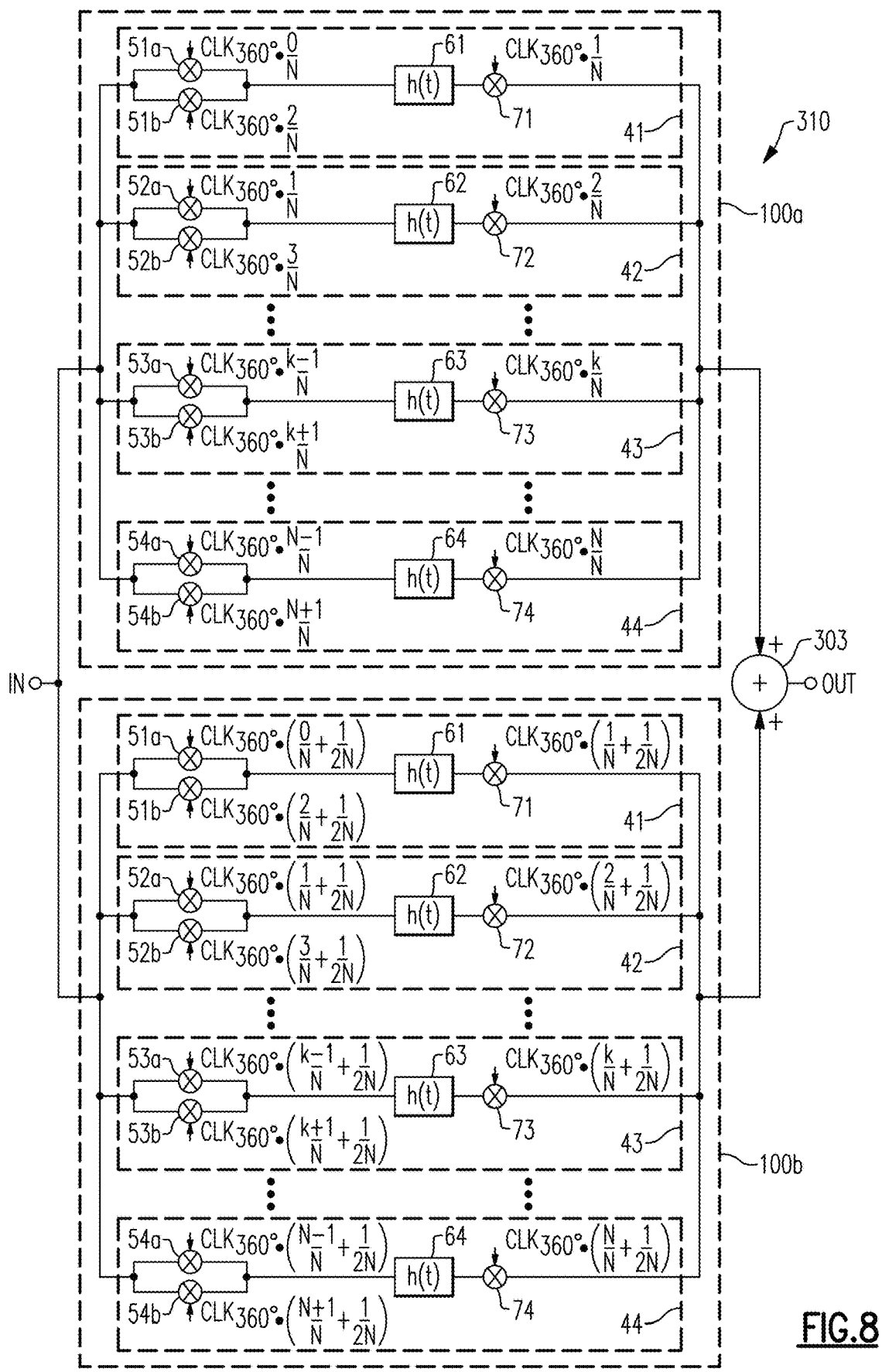
FIG. 8 is a schematic diagram of another embodiment of a multipath filter system with sideband rejection.

FIG. 8 is a schematic diagram of another embodiment of a multipath filter system 310 with sideband rejection. The multipath filter system 310 includes a first multipath filter 100a, a second multipath filter 100b, and a combiner 303. The first multipath filter 100a and the second multipath filter 100b are electrically connected in parallel with one another between an input terminal IN and an output terminal OUT.

The first multipath filter 100a is implemented using the multipath filter 100 shown in the embodiment of FIG. 2C. Additionally, the first multipath filter 100a operates with clock signal phases as described above with respect to FIG. 2C. The second multipath filter 100b is also implemented using the multipath filter 100 shown in the embodiment of FIG. 2C, but operates with clock signal phases that lag the clock signal phases of the first multipath filter 100a. In particular, each of the clock signal phases of the second multipath filter 100b lags a corresponding one of the clock signal phases of the first multipath filter 100a by 360°/(2N).

By implementing the clock phases in this manner, the output signal of the first multipath filter 100a combines with the output signal of the second multipath filter 100b in a manner that reduces or eliminates sideband power.

Although FIG. 8 illustrates a multipath filter system in which the outputs of two instantiations of the multipath filter 100 of FIG. 2C are combined to reduce sideband power, the outputs of any of the multipath filters described herein can be combined to provide sideband power reduction.

Examples of RF Systems, Modules, and Devices Implemented with One or More Multipath Filters Multipath filters can be implemented in a wide range of RF systems, modules, and devices. Although various examples of such RF systems, modules, and devices are described, the teachings herein are applicable to a wide range of electronics.

Figure 9A:
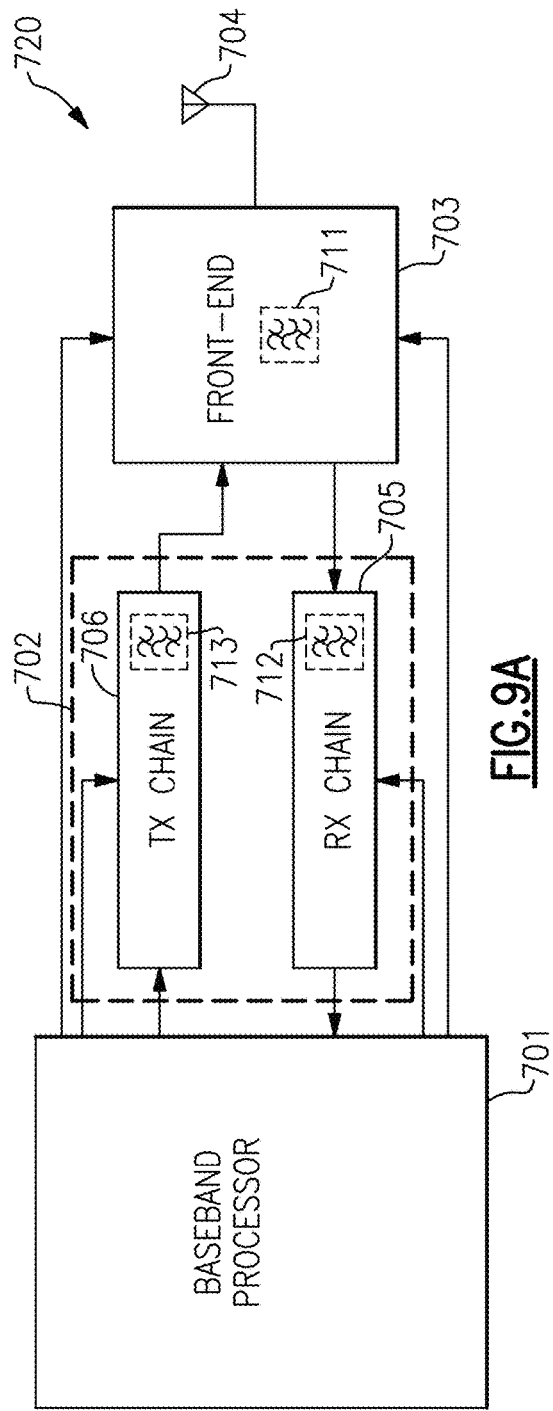
FIG. 9A is a schematic diagram of one embodiment of a radio frequency system.

FIG. 9A is a schematic diagram of one embodiment of an RF system 720. The RF system 720 includes baseband processor 701, a transceiver 702, a front-end 703, and an antenna 704. The transceiver 702 includes a receiver chain 705 and a transmitter chain 706.

As shown in FIG. 9A, various circuitry of the RF system 720 can include one or more multipath filters implemented in accordance with the teachings herein. For example, in the illustrated embodiment, the front-end 703 includes one or more multipath filters 711, the receive chain 705 includes one or more multipath filters 712, and/or the transmit chain 706 includes one or more multipath filters 713. Although an example configuration of multipath filters is shown, an RF system can include multipath filters implemented in a wide variety of ways.

Figure 9B:
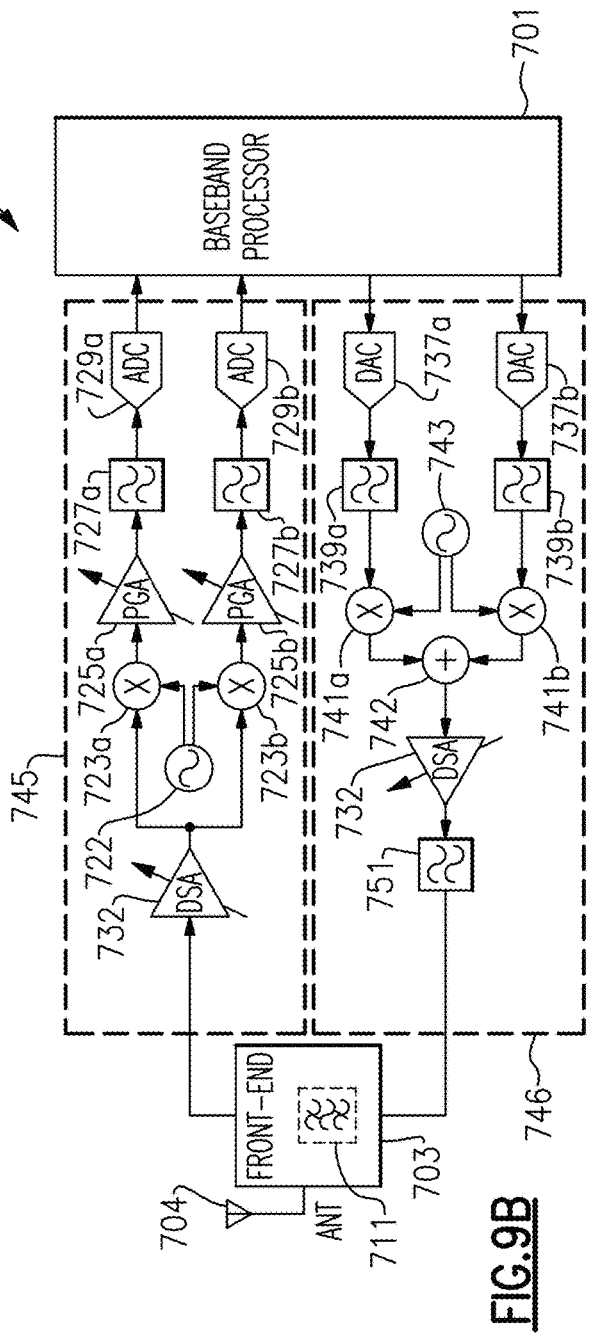
FIG. 9B is a schematic diagram of another embodiment of a radio frequency system.

FIG. 9B is a schematic diagram of another embodiment of an RF system 730. The RF system 730 includes a baseband processor 701, a receive circuit 745, a transmit circuit 746, a front-end system 703, and an antenna 704. The RF system 730 illustrates one example implementation of radio frequency circuitry suitable for operation in a mobile device or base station. However, mobile devices and base stations can be implemented in a wide variety of ways.

The RF system 730 can be used for transmitting and/or receiving RF signals using a variety of communication standards, including, for example, Global System for Mobile Communications (GSM), Code Division Multiple Access (CDMA), wideband CDMA (W-CDMA), Long Term Evolution (LTE), Advanced LTE, 3G (including 3GPP), 4G, Enhanced Data Rates for GSM Evolution (EDGE), wireless local loop (WLL), and/or Worldwide Interoperability for Microwave Access (WiMax), as well as other proprietary and non-proprietary communications standards.

The transmit circuit 746 and the receive circuit 745 can be used for transmitting and receiving signals over the antenna 704. Although one implementation of the RF system 730 is illustrated in FIG. 9B, the RF system 730 can be modified in any suitable manner. For example, the RF system 730 can be modified to include additional transmit circuits, receive circuits, front-ends, and/or antennas.

In the illustrated configuration, the receive circuit 745 includes a digital step attenuator (DSA) 732, a local oscillator 722, a first mixer 723a, a second mixer 723b, a first programmable gain amplifier (PGA) 725a, a second PGA 725b, a first filter 727a, a second filter 727b, a first analog-to-digital converter (ADC) 729a, and a second ADC 729b. Although one implementation of a receive circuit is illustrated in FIG. 9B, a receive circuit can include more or fewer components and/or a different arrangement of components.

An RF signal can be received on the antenna 704 and provided to the receive circuit 745 using the front-end system 703. For example, the front-end system 703 can be controlled to electrically couple the antenna 704 to an input of the DSA 732. In the illustrated embodiment, an amount of attenuation provided by the DSA 732 is digitally-controllable, and can be set to achieve a desired signal power level.

The first and second mixers 723a, 723b receive first and second local oscillator clock signals, respectively, from the local oscillator 722. The first and second local oscillator clock signals can have about the same frequency and a phase difference equal to about a quarter of a period, or about 90°. The first and second mixers 723a, 723b downconvert the output of the DSA 732 using the first and second local oscillator clock signals, respectively, thereby generating first and second demodulated signals. The first and second demodulated signals can have a relative phase difference of about a quarter of a period, or about 90°, and can correspond to an in-phase (I) receive signal and a quadrature-phase (Q) signal, respectively. In certain implementations, one of the first or second oscillator clock signals is generated by phase shifting from the other.

The first and second local oscillator clock signals can have a frequency selected to achieve a desired intermediate frequency and/or baseband frequency for the first and second demodulated signals. For example, multiplying the output of the DSA 732 by a sinusoidal signal from the local oscillator 722 can produce a mixed signal having a frequency content centered about the sum and difference frequencies of the carrier frequency of the DSA output signal and the oscillation frequency of the local oscillator 722.

In the illustrated configuration, the first and second demodulated signals are amplified using the first and second programmable gain amplifiers 725a, 725b, respectively. To aid in reducing output noise, the outputs of the first and second programmable gain amplifiers 725a, 725b can be filtered using the first and second filters 727a, 727b, which can be any suitable filter, including, for example, low pass, band pass, or high pass filters. The outputs of the first and second filters 727a, 727b can be provided to the first and second ADCs 729a, 729b, respectively. The first and second ADCs 729a, 729b can have any suitable resolution. In the illustrated configuration, the outputs of the first and second ADCs 729a, 729b are provided to the baseband processor 701 for processing.

The baseband processor 701 can be implemented in a variety of ways. For instance, the baseband processor 701 can include a digital signal processor, a microprocessor, a programmable core, the like, or any combination thereof. Moreover, in some implementations, two or more baseband processors can be included in the RF system 730.

As shown in FIG. 9B, the transmit circuit 746 receives data from the baseband processor 701 and is used to transmit RF signals via the antenna 704. The transmit circuit 746 and the receive circuit 745 both operate using the antenna 704, and access to the antenna 704 is controlled using the front-end system 703. The illustrated transmit circuit 746 includes first and second digital-to-analog converters (DACs) 737a, 737b, first and second filters 739a, 739b, first and second mixers 741a, 741b, a local oscillator 743, a combiner 742, a DSA 732, and an output filter 751. Although one implementation of a transmit circuit is illustrated in FIG. 9B, a transmit circuit can include more or fewer components and/or a different arrangement of components.

The baseband processor 701 can output a digital in-phase (I) signal and a digital quadrature-phase (Q) signal, which can be separately processed until they are combined using the combiner 742. The first DAC 737a converts the digital I signal into an analog I signal, and the second DAC 737b converts the digital Q signal into an analog Q signal. The first and second DACs 737a, 737b can have any suitable precision. The analog I signal and the analog Q signal can be filtered using the first and second filters 739a, 739b, respectively. The outputs of the first and second filters 739a, 739b can be upconverted using the first and second mixers 741a, 741b, respectively. For example, the first mixer 741a is used to upconvert the output of the first filter 739a based on an oscillation frequency of the local oscillator 743, and the second mixer 741b is used to upconvert the output of the second filter 739b based on the oscillation frequency of the local oscillator 743.

The combiner 742 combines the outputs of the first and second mixers 741a, 741b to generate a combined RF signal. The combined RF signal is provided to an input of the DSA 732, which is used to control a signal power level of the combined RF signal.

The output of the DSA 732 can be filtered using the output filter 751, which can be, for example, a low pass, band pass, or high pass filter configured to remove noise and/or unwanted frequency components from the signal. The output of the output filter 751 is provided to the antenna 704 through the front-end system 703, which can include a power amplifier.

The illustrated RF system 730 can include one or more multipath filters implemented using one or more features discloses herein. For example, the RF front-end system 703, the receive circuit 745, and/or the transmit circuit 746 can include one or more multipath filters with double-in double-switched downconversion.

Although FIG. 9B illustrates one example of an RF system that can include a front-end system implemented in accordance with the teachings herein, the front-end systems herein can be used in other configurations of electronics.

Figure 10:
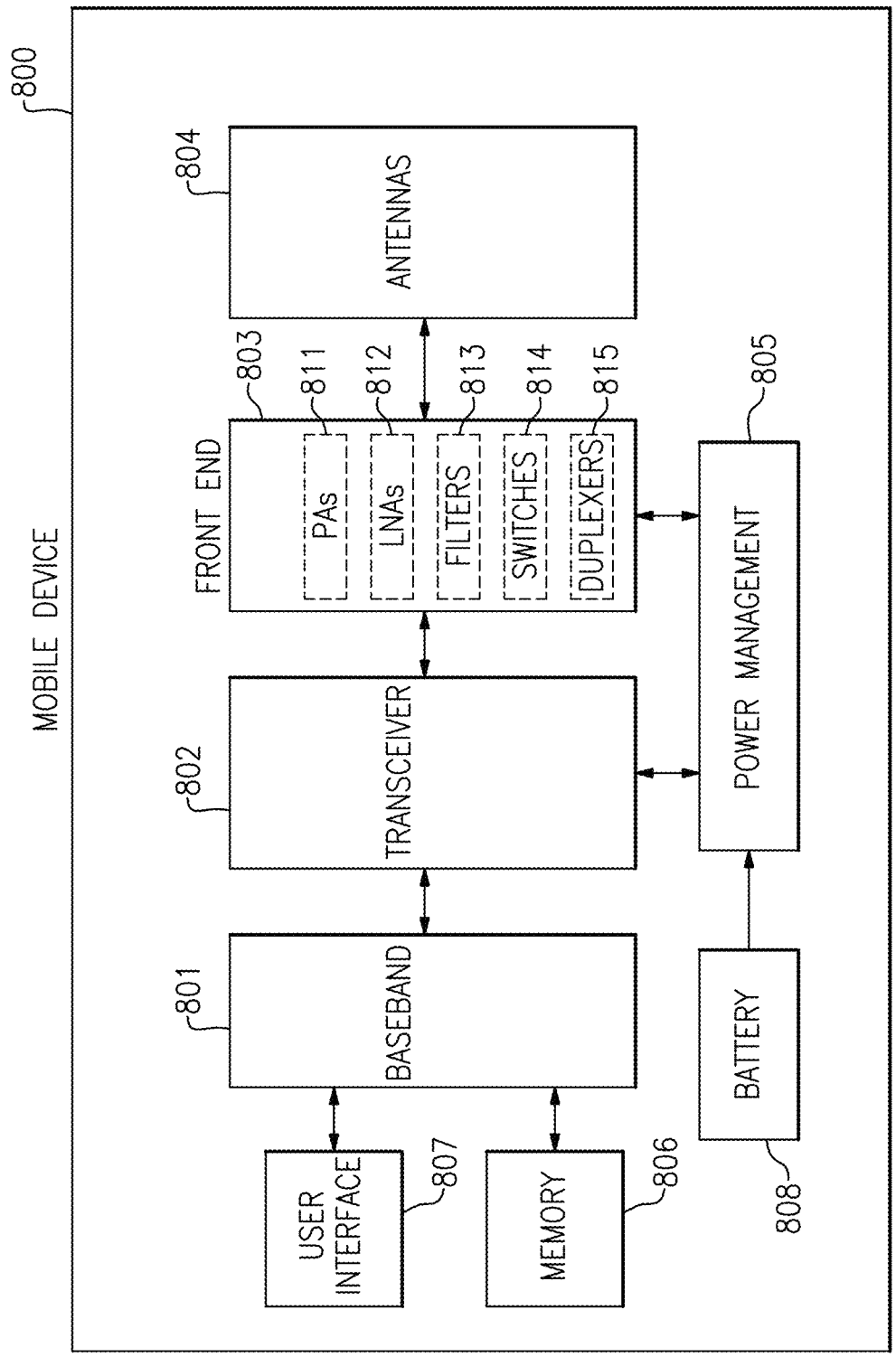
FIG. 10 is a schematic diagram of one embodiment of a mobile device.

FIG. 10 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 10 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes power amplifiers (PAs) 811, low noise amplifiers (LNAs) 812, filters 813, switches 814, and duplexers 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

The filters 813 of the front end system 803 can include one or more multipath filters implemented in accordance with the teachings herein.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 10, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 10, the power management system 805 receives a battery voltage from the battery 808. The battery 808 can be any suitable battery for use in the mobile device 800, including, for example, a lithium-ion battery.

Figure 11A:
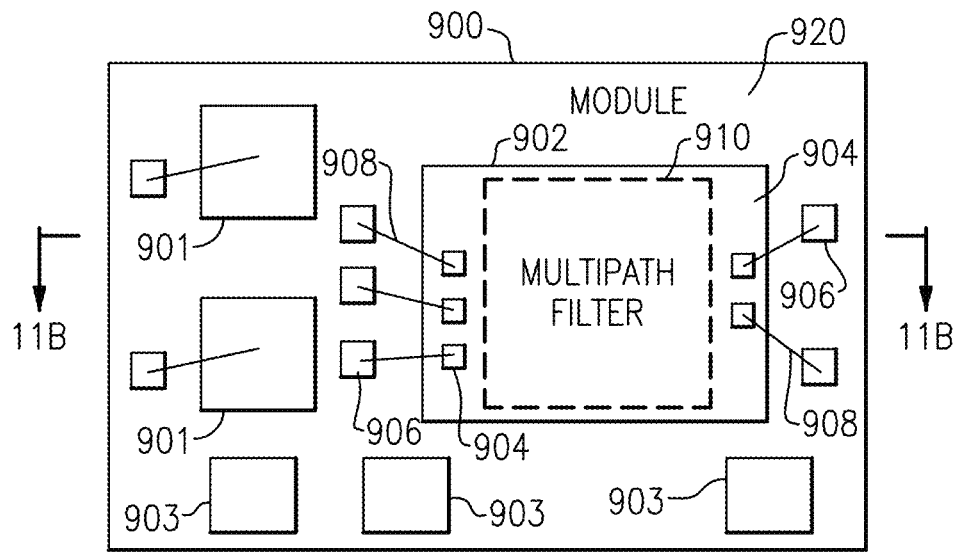
FIG. 11A is a schematic diagram of one embodiment of a packaged module.
Figure 11B:
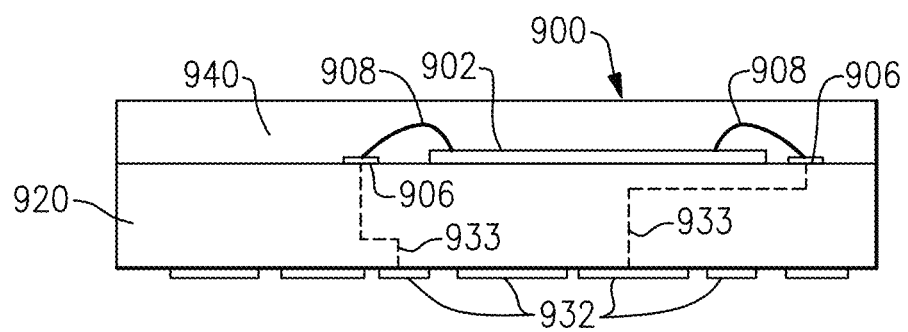
FIG. 11B is a schematic diagram of a cross-section of the packaged module of FIG. 11A taken along the lines 11B-11B.

FIG. 11A is a schematic diagram of one embodiment of a packaged module 900. FIG. 11B is a schematic diagram of a cross-section of the packaged module 900 of FIG. 11A taken along the lines 11B-11B.

The packaged module 900 includes radio frequency components 901, a semiconductor die 902, surface mount devices 903, wirebonds 908, a package substrate 920, and encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes at least one multipath filter 910 implemented in accordance with the teachings herein. In certain implementations, the packaged module 900 corresponds to a front-end module (FEM).

Although the packaged module 900 illustrates one example of a module implemented in accordance with the teachings herein, other implementations are possible.

As shown in FIG. 11B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a wireless device. The example contact pads 932 can be configured to provide radio frequency signals, bias signals, and/or power (for example, a power supply voltage and ground) to the semiconductor die 902. As shown in FIG. 11B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Multipath filters can be included in various electronic devices, including, but not limited to consumer electronic products, parts of the consumer electronic products, electronic test equipment, etc. Examples of the electronic devices can also include, but are not limited to, circuits of communication networks. The consumer electronic products can include, but are not limited to, a mobile phone, a tablet, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A multipath filter comprising:
   an input terminal configured to receive a radio frequency signal;
   an output terminal configured to output a filtered radio frequency signal;
   a first filter circuit branch electrically connected between the input terminal and the output terminal, the first filter circuit branch including a first downconverter including a parallel combination of a first pair of mixers, the parallel combination of the first pair of mixers having a first pair of inputs connected to one another and a first pair of outputs connected to one another, the first filter circuit branch further including a first filter network and a first upconverter in series with the parallel combination of the first pair of mixers; and
   a second filter circuit branch electrically connected between the input terminal and the output terminal and in parallel with the first filter circuit branch, the second filter circuit branch including a second downconverter including a parallel combination of a second pair of mixers, the parallel combination of the second pair of mixers having a second pair of inputs connected to one another and a second pair of outputs connected to one another, the second filter circuit branch further including a second filter network and a second upconverter in series with the parallel combination of the second pair of mixers.

2. The multipath filter of claim 1 wherein the parallel combination of the first pair of mixers operates with a first pair of clock signals of a common clock signal frequency but of different phases.

3. The multipath filter of claim 2 wherein the multipath filter is operable to attenuate a frequency component of the radio frequency signal at the common clock signal frequency.

4. The multipath filter of claim 2 wherein the multipath filter is operable to pass a frequency component of the radio frequency signal at about twice the common clock signal frequency.

5. The multipath filter of claim 2 wherein the first pair of clock signals includes a first clock signal of a first phase and a second clock signal of a second phase, the first upconverter operating with a third clock signal of a third phase.

6. The multipath filter of claim 5 wherein the third phase is about half way between the first phase and the second phase.

7. The multipath filter of claim 1 wherein the first filter network includes a low pass filter.

8. The multipath filter of claim 1 further comprising a third filter circuit branch electrically connected between the input terminal and the output terminal and in parallel with the first filter circuit branch and the second filter circuit branch, the third filter circuit branch including a third downconverter including a parallel combination of a third pair of mixers, the third filter circuit branch further including a third filter network and a third upconverter in series with the parallel combination of the third pair of mixers.

9. The multipath filter of claim 1 wherein the first filter circuit branch and the second filter circuit branch are each implemented differentially.

10. A mobile device comprising:
    an antenna configured to receive a radio frequency signal; and
    a front end system including a multipath filter configured to receive the radio frequency signal at an input terminal and to output a filtered radio frequency signal at an output terminal, the multipath filter including a first filter circuit branch electrically connected between the input terminal and the output terminal, the first filter circuit branch including a first downconverter including a parallel combination of a first pair of mixers, the parallel combination of the first pair of mixers having a first pair of inputs connected to one another and a first pair of outputs connected to one another, the first filter circuit branch further including a first filter network and a first upconverter in series with the parallel combination of the first pair of mixers, the multipath filter further including a second filter circuit branch electrically connected between the input terminal and the output terminal and in parallel with the first filter circuit branch, the second filter circuit branch including a second downconverter including a parallel combination of a second pair of mixers, the parallel combination of the second pair of mixers having a second pair of inputs connected to one another and a second pair of outputs connected to one another, the second filter circuit branch further including a second filter network and a second upconverter in series with the parallel combination of the second pair of mixers.

11. The mobile device of claim 10 wherein the first pair of mixers operates with a first pair of clock signals of a common clock signal frequency but of different phases.

12. The mobile device of claim 11 wherein the multipath filter is operable to attenuate a frequency component of the radio frequency signal at the common clock signal frequency.

13. The mobile device of claim 11 wherein the first pair of clock signals includes a first clock signal of a first phase and a second clock signal of a second phase, the first upconverter operating with a third clock signal of a third phase that is about half way between the first phase and the second phase.

14. The mobile device of claim 10 wherein the multipath filter further includes a third filter circuit branch electrically connected between the input terminal and the output terminal and in parallel with the first filter circuit branch and the second filter circuit branch, the third filter circuit branch including a third downconverter including a parallel combination of a third pair of mixers, the third filter circuit branch further including a third filter network and a third upconverter in series with the parallel combination of the third pair of mixers.

15. The mobile device of claim 10 further comprising a transceiver configured to receive the filtered radio frequency signal.

16. A packaged module comprising:
a package substrate; and
a semiconductor die attached to the package substrate, the semiconductor die including a multipath filter configured to receive the radio frequency signal at an input terminal and to output a filtered radio frequency signal at an output terminal, the multipath filter including a first filter circuit branch electrically connected between the input terminal and the output terminal, the first filter circuit branch including a first downconverter including a parallel combination of a first pair of mixers, the parallel combination of the first pair of mixers having a first pair of inputs connected to one another and a first pair of outputs connected to one another, the first filter circuit branch further including a first filter network and a first upconverter in series with the parallel combination of the first pair of mixers, the multipath filter further including a second filter circuit branch electrically connected between the input terminal and the output terminal and in parallel with the first filter circuit branch, the second filter circuit branch including a second downconverter including a parallel combination of a second pair of mixers, the parallel combination of the second pair of mixers having a second pair of inputs connected to one another and a second pair of outputs connected to one another, the second filter circuit branch further including a second filter network and a second upconverter in series with the parallel combination of the second pair of mixers.

17. The packaged module of claim 16 wherein the parallel combination of the first pair of mixers operates with a first pair of clock signals of a common clock signal frequency but of different phases.

18. The packaged module of claim 17 wherein the multipath filter is operable to attenuate a frequency component of the radio frequency signal at the common clock signal frequency.

19. The packaged module of claim 17 wherein the first pair of clock signals includes a first clock signal of a first phase and a second clock signal of a second phase, the first upconverter operating with a third clock signal of a third phase that is about half way between the first phase and the second phase.

20. The packaged module of claim 16 wherein the multipath filter further includes a third filter circuit branch electrically connected between the input terminal and the output terminal and in parallel with the first filter circuit branch and the second filter circuit branch, the third filter circuit branch including a third downconverter including a parallel combination of a third pair of mixers, the third filter circuit branch further including a third filter network and a third upconverter in series with the parallel combination of the third pair of mixers.

* * * * *